US006992363B2

(12) United States Patent
Akiyama et al.

(10) Patent No.: US 6,992,363 B2

(45) Date of Patent: Jan. 31, 2006

(54) DIELECTRIC SEPARATION TYPE SEMICONDUCTOR DEVICE AND METHOD OF MANUFACTURING THE SAME

(75) Inventors: Hajime Akiyama, Tokyo (JP); Naoki Yasuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/612,985

(22) Filed: Jul. 7, 2003

(65) Prior Publication Data

US 2004/0119132 A1 Jun. 24, 2004

(30) Foreign Application Priority Data

Dec. 19, 2002 (JP) ............................ 2002-368186

(51) Int. Cl.
*H01L 29/00* (2006.01)
*H01L 27/01* (2006.01)

(52) U.S. Cl. ...................... 257/509; 257/347; 257/506; 257/510

(58) Field of Classification Search ........ 257/347–354, 257/372–374, 499, 506, 509–513
See application file for complete search history.

(56) References Cited

U.S. PATENT DOCUMENTS 4,710,794 A 12/1987 Koshino et al.
4,860,081 A * 8/1989 Cogan ........................ 257/501
4,963,505 A * 10/1990 Fujii et al. .................. 438/405
5,294,825 A 3/1994 Nakagawa et al.
5,387,555 A * 2/1995 Linn et al. .................. 438/455
5,476,809 A * 12/1995 Kobayashi .................. 438/405
5,554,872 A 9/1996 Baba et al.
5,561,077 A 10/1996 Terashima
5,777,365 A 7/1998 Yamaguchi et al.
6,069,396 A 5/2000 Funaki
6,297,532 B1 10/2001 Yamamoto et al.
6,326,292 B1 12/2001 Söderbärg et al.

FOREIGN PATENT DOCUMENTS

EP 0 513 764 A2 11/1992

(Continued)

OTHER PUBLICATIONS

Patent Abstracts of Japan of 09-172189.

(Continued)

*Primary Examiner*—Ori Nadav
(74) *Attorney, Agent, or Firm*—Oblon, Spivak, McClelland & Neustadt, P.C.

(57) ABSTRACT

A dielectric separation type semiconductor device having high voltage withstanding capability includes a primary dielectric layer (3-1) on a first surface of a semiconductor substrate (1), a first conductivity type first semiconductor layer (2) disposed oppositely to the substrate (1) with the primary dielectric layer (3-1) sandwiched, a first conductivity type second semiconductor layer (4) on the first semiconductor layer (2), a second conductivity type third semiconductor layer (5) surrounding peripherally the first semiconductor layer (2), a ring-like insulation film (9) surrounding peripherally the third semiconductor layer (5), a first electrode (6) on the second semiconductor layer (4), a second electrode (7) on the third semiconductor layer (5), a back-surface electrode (8) deposited on a second surface of the substrate (1), and a first auxiliary dielectric layer (3-2) disposed immediately below the second semiconductor layer (4), being junctioned to the second surface.

15 Claims, 11 Drawing Sheets

FOREIGN PATENT DOCUMENTS

| | | |
|---|---|---|
| JP | 9-172189 | 6/1997 |
| JP | 2000-150501 | 5/2000 |
| EP | 0 615 292 A1 | 9/1994 |
| JP | 5-136436 | 6/1993 |
| JP | 7-245382 | 9/1995 |
| JP | 9-97886 | 4/1997 |

OTHER PUBLICATIONS

Korean Office Action w/English translation.
Patent Abstracts of Japan 20000150501.
Patent Abstracts of Japan 09097888.
French Preliminary Search Report.

* cited by examiner

DIELECTRIC SEPARATION TYPE SEMICONDUCTOR DEVICE AND METHOD OF MANUFACTURING THE SAME

BACKGROUND OF THE INVENTION

1. Field of the Invention

The present invention relates to a dielectric separation type semiconductor device which includes a dielectric layer and a back-surface electrode provided on a top surface and a bottom back surface, respectively, of a semiconductor substrate. Further, the present invention is concerned with a method of manufacturing the dielectric separation type semiconductor device as well.

2. Related Art

A variety of dielectric separation type semiconductor devices have heretofore been proposed. Byway of example, reference may have to be made to Japanese Patent No. 2739018 (FIGS. 52 to 57).

As is shown in FIGS. 52 and 53 of the publication mentioned above, a dielectric layer and a back-surface electrode are provided on a top surface and a bottom or back surface, respectively, of a semiconductor substrate in the dielectric separation type semiconductor device disclosed in the above-mentioned patent, wherein an $n^-$-type semiconductor layer is provided on the top surface of the dielectric layer.

The dielectric layer isolates dielectrically the semiconductor substrate and the $n^-$-type semiconductor layer from each other, wherein the $n^-$-type semiconductor layer is delimited to a predetermined range by an insulation film.

In the predetermined range mentioned above, an $n^+$-type semiconductor region of a relatively low resistance value is formed on the top surface of the $n^-$-type semiconductor layer. Further, a $p^+$-type semiconductor region is so formed as to surround the $n^+$-type semiconductor region. A cathode electrode and an anode electrode are contacted to the $n^+$-type semiconductor region and the $p^+$-type semiconductor region, respectively, wherein the cathode electrode and the anode electrode are insulated from each other by an interposed insulation film.

As shown in FIG. 54 of the aforementioned Japanese Patent No. 2739018, when a voltage of positive (plus) polarity applied to the cathode electrode is gradually increased in the state where the anode electrode and the back-surface electrode are each set to the zero potential (zero volt or 0 V), a depletion layer extends or spreads from a pn junction formed between the $n^-$-type semiconductor layer and the $p^+$-type semiconductor region. In this state, the semiconductor substrate is fixed to the ground potential and serves as a field plate through the medium of the dielectric layer. Consequently, in addition to the depletion layer mentioned above, an additional depletion layer spreads from a boundary between the $n^-$-type semiconductor layer and the dielectric layer toward the top surface of the $n^-$-type semiconductor layer.

Owing to the extension of the additional depletion layer, the first mentioned depletion layer tends to spread toward the cathode electrode, as a result of which the intensity of the electric field at the pn junction between the $n^-$-type semiconductor layer and the $p^+$-type semiconductor region is mitigated or reduced. This effect is generally known as the RESURF (REduced SURface Field) effect.

As is described in the aforementioned patent by reference to FIG. 55, with the distribution of electric field intensity at a section sufficiently distanced from the $p^+$-type semiconductor region, the total voltage drop V making appearance at the section mentioned above can be represented by the following expression (3)

$$V=q\cdot N/(\epsilon_2\cdot\epsilon_0)\times(x^2/2+\epsilon_2\cdot t_0\cdot x/\epsilon_3) \tag{3}$$

where x represents the width of the additional depletion layer in the vertical direction, $t_0$ represents the thickness of the dielectric layer, N represents the impurity concentration [$cm^{-3}$] of the $n^-$-type semiconductor layer, $\epsilon_0$ represents the dielectric constant of vacuum [$C\cdot V^{-1}\cdot cm^{-1}$], $\epsilon_2$ represents the relative dielectric constant of the $n^-$-type semiconductor layer and $\epsilon_3$ represents the relative dielectric constant of the dielectric layer. In this conjunction, it is presumed that the top surface of the $n^-$-type semiconductor layer is located at the origin of the abscissa in the distribution of electric field intensity mentioned above.

It can be seen from the expression (3) that the width x of the additional depletion layer in the vertical direction decreases when the thickness $t_0$ of the dielectric layer is increased while maintaining the total voltage drop to be constant. This means that the RESURF effect becomes enfeebled.

On the other hand, under the condition that no avalanche breakdown takes place due to the concentration of the electric field at the pn junction between the $n^-$-type semiconductor layer and the $p^+$-type semiconductor region and the concentration of the electric field at the interface between the $n^-$-type semiconductor layer and the $n^+$-type semiconductor region, the blocking voltage (voltage withstanding capability, to say in another way) is ultimately determined by the avalanche breakdown brought about by the concentration of the electric field at the interface between the $n^-$-type semiconductor layer and the dielectric layer immediately below the $n^+$-type semiconductor region.

In order to implement the semiconductor device so that the condition mentioned above is satisfied, it is required to set sufficiently long the distance between the $p^+$-type semiconductor region and the $n^+$-type semiconductor region while optimizing the thickness d and the impurity concentration of the $n^-$-type semiconductor layer.

In this conjunction, it is generally known that the concentration of the electric field at the interface between the $n^-$-type semiconductor layer and the dielectric layer just satisfies the condition for the avalanche breakdown when depletion has reached the surface of the $n^-$-type semiconductor layer from the interface between the $n^-$-type semiconductor layer and the dielectric layer, as is described in the aforementioned patent specification by reference to FIG. 56. In that case, the depletion layer reaches the $n^-$-type semiconductor layer with the whole $n^-$-type semiconductor layer being depleted.

Under the condition mentioned above, the blocking voltage V can be given by the following expression:

$$V=Ecr\cdot(d/2+\epsilon_2\cdot t_0/\epsilon_3) \tag{4}$$

where Ecr represents a critical electric field intensity at which the avalanche breakdown takes place. The thickness of the $n^+$-type semiconductor region is neglected.

Further, as is described in the aforementioned patent specification by reference to FIG. 57, in the distribution of electric field intensity in the vertical direction at the section located immediately below the $n^+$-type semiconductor region, the electric field intensity at the boundary between the $n^-$-type semiconductor layer and the dielectric layer (location distanced by d from the origin toward the electrode) attains the critical electric field intensity Ecr.

In the case where the $n^-$-type semiconductor layer is formed of silicon with the dielectric layer being formed of a silicon oxide film, the values of the distance d and the thickness $t_0$ adopted in calculating the blocking voltage V of the semiconductor device in accordance with the expression (4) are generally as follows:

$$d=4\times10^{-4}$$

$$t_0=2\times10^{-4}$$

The critical electric field intensity Ecr is subjected to the influence of the thickness d of the $n^-$-type semiconductor layer. In general, however, the critical electric field intensity Ecr may well be $4\times10^{-5}$. Accordingly, in accordance with the expression (4), the blocking voltage V can be determined as follows:

$$V=320\ V \quad (5)$$

provided that $Ecr=4\times10^{-5}$, $\in_2=11.7$, $\in_3=3.9$.

Thus, when the thickness d of the $n^-$-type semiconductor layer is increased by 1 $\mu$m, a voltage increment $\Delta V$ is determined as follows:

$$\Delta V=Ecr\times0.5\times10^{-4}=20\ [V] \quad (6)$$

On the other hand, when the thickness $t_0$ of the dielectric layer increases by 1 $\mu$m, the voltage increment $\Delta V$ is determined as follows:

$$\Delta V=Ecr\times11.7\times10^{-4}/3.9=120\ [V] \quad (7)$$

As can be seen from the results of calculations (6) and (7), the blocking voltage (voltage withstanding capability) can be increased by forming thicker the dielectric layer than $n^-$-type semiconductor layer. In other words, the blocking voltage or voltage withstanding capability can be increased or enhanced more effectively by increasing the thickness of the evaporation in three layers.

In this conjunction, it is further noted that difficulty is encountered in increasing the thickness of the $n^-$-type semiconductor layer because the trench etching process for forming a deeper trench is required, which demands development of novel etching technique.

However, when the thickness $t_0$ of the dielectric layer is increased, extension x of the additional depletion layer decreases, reducing the RESURF effect. In other words, concentration of the electric field increases at the pn junction between the $p^+$-type semiconductor region and the $n^-$-type semiconductor layer, resulting in that the blocking voltage or voltage withstanding capability of the semiconductor device is limited by the avalanche breakdown taking place at the pn junction.

As is apparent from the foregoing, the dielectric separation type semiconductor device known heretofore suffers a problem that the blocking voltage or voltage withstanding capability of the semiconductor device is limited in dependence on the thickness $t_0$ of the dielectric layer and the thickness d of the $n^-$-type semiconductor layer.

SUMMARY OF THE INVENTION

In the light of the state of the art described above, it is an object of the present invention to provide a dielectric separation type semiconductor device whose blocking voltage is prevented from being limited in dependence on the thickness of the dielectric layer and that of the first semiconductor layer and which can thus enjoy a significantly enhanced voltage withstanding capability.

Another object of the present invention is to provide a method of manufacturing the dielectric separation type semiconductor device described above.

In view of the above and other objects which will become apparent as the description proceeds, there is provided according to a general aspect of the present invention a dielectric separation type semiconductor device which includes a semiconductor substrate, a primary dielectric layer disposed adjacent to a whole region of a first main surface of the semiconductor substrate, a first conductivity type first semiconductor layer of a low impurity concentration disposed on a surface of the primary dielectric layer in opposition to the semiconductor substrate so that the primary dielectric layer is sandwiched between the first conductivity type first semiconductor layer and the semiconductor substrate, a first conductivity type second semiconductor layer of a high impurity concentration formed selectively on the surface of the first semiconductor layer, a second conductivity type third semiconductor layer of a high impurity concentration disposed so as to surround an outer peripheral edge of the first semiconductor layer with a distance, a ring-like insulation film disposed so as to surround an outer peripheral edge of the third semiconductor layer, a first main electrode disposed in contact with a surface of the second semiconductor layer, a second main electrode disposed in contact with a surface of the third semiconductor layer, a sheet-like back-surface electrode disposed adjacent to a second main surface of the semiconductor substrate on a side opposite to the first main surface of the semiconductor substrate, and a first auxiliary dielectric layer disposed immediately below the second semiconductor layer and having at least a portion junctioned to a second main surface of the primary dielectric layer.

According to another aspect of the present invention, there is provided a method of manufacturing a dielectric separation type semiconductor device in the form of a high-voltage-rated lateral array type semiconductor device implemented in a dielectric-isolated substrate and having a first main electrode and a second main electrode which is formed so as to surround the first main electrode and including a semiconductor substrate disposed on a back surface side of the dielectric-isolated substrate to serve as a pedestal (base), which method includes the steps of removing the semiconductor substrate by etching with KOH within a region which covers the first main electrode and extends over an area of a size not smaller than 40% of a distance between the first main electrode and the second main electrode, forming a first buried insulation film in the region, and forming a second buried insulation film immediately beneath the first buried insulation film in contact therewith.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

Figure 1:
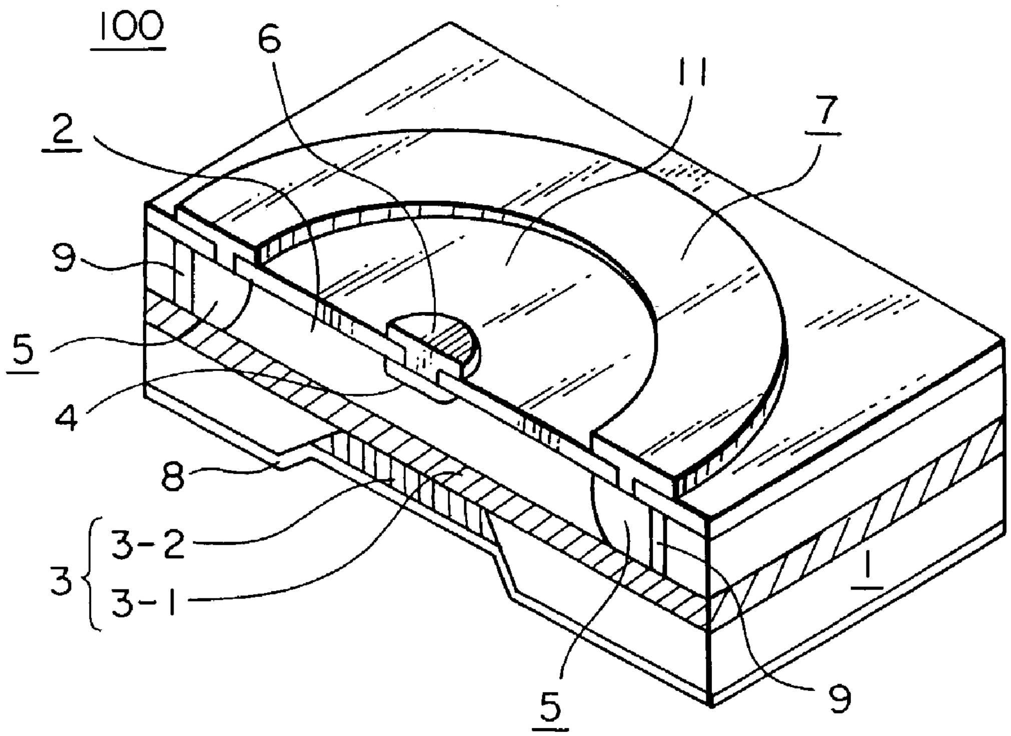
FIG. 1 is a perspective view showing partially in section a dielectric separation type semiconductor according to a first embodiment of the present invention.

The present invention will be described in detail in conjunction with what is presently considered as preferred or typical embodiments thereof by reference to the drawings. In the following description, like reference characters designate like or corresponding parts throughout the several views. In the following description, it is to be understood that such terms as "top", "bottom", "back", "vertical" and the like are words of convenience and are not to be construed as limiting terms.

Embodiment 1

Now, a first embodiment of the present invention will be described by reference to the drawing. FIG. 1 is a perspective view showing partially in section a dielectric separation type semiconductor device 100 according to the first embodiment of the present invention, and FIG. 2 is a sectional view showing a portion of the semiconductor device 100 shown in FIG. 1.

Figure 2:
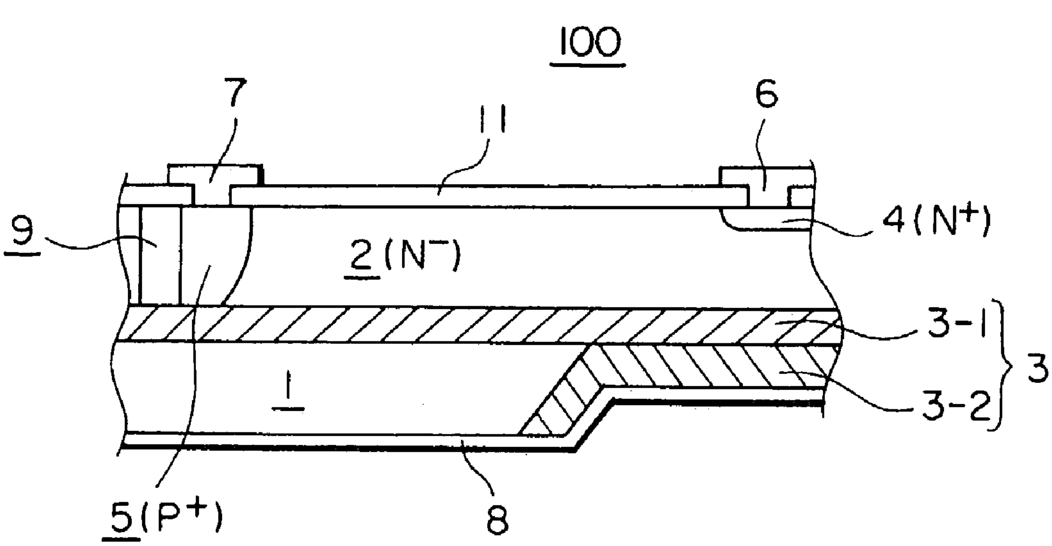
FIG. 2 is a sectional view showing a portion of the dielectric separation type semiconductor according to the first embodiment of the invention.

Referring to FIGS. 1 and 2, the dielectric separation type semiconductor device 100 is comprised of a semiconductor substrate 1, an $n^-$-type semiconductor layer 2, a dielectric layer generally denoted by reference numeral 3, an $n^+$-type semiconductor region 4, a $p^+$-type semiconductor region 5, electrodes 6 and 7, a evaporated back-surface electrode (hereinafter referred to simply as "back-surface electrode") 8 and insulation films 9 and 11.

The dielectric layer 3 and the back-surface electrode 8 are formed, respectively, on the top and bottom or back surfaces of the semiconductor substrate 1.

The $n^-$-type semiconductor layer 2 is formed on the top surface of the dielectric layer 3, wherein the semiconductor substrate 1 and the $n^-$-type semiconductor layer 2 are isolated or separated from each other by the dielectric layer 3 interposed therebetween.

The insulation film 9 of a ring-like shape in cross-section serves to delimit the $n^-$-type semiconductor layer 2 to a predetermined circular region.

Within the predetermined region delimited by the insulation film 9, the $n^+$-type semiconductor region 4 having a resistance value lower than that of the $n^-$-type semiconductor layer 2 is formed on the top surface of the $n^-$-type semiconductor layer 2. Further, in the $n^-$-type semiconductor layer 2, the $p^+$-type semiconductor region 5 is so formed as to surround the $n^+$-type semiconductor region 4.

The $p^+$-type semiconductor region 5 is formed selectively in the top surface of the $n^-$-type semiconductor layer 2.

The electrodes 6 and 7 are contacted to the $n^+$-type semiconductor region 4 and the $p^+$-type semiconductor region 5, respectively, wherein the electrodes 6 and 7 are insulated from each other by the insulation film 11.

In this conjunction, it is to be mentioned that the electrodes 6 and 7 serve as the cathode electrode and the anode electrode, respectively. Accordingly, these electrodes 6 and 7 will hereinafter also be referred to as "cathode electrode 6" and "anode electrode 7", respectively, for the convenience of description.

The dielectric layer 3 is partitioned into a first region 3-1 constituted by a relatively thin dielectric layer and a second region 3-2 constituted by a relatively thick dielectric layer.

The $n^+$-type semiconductor region 4 is formed above the second region 3-2 of the dielectric layer 3 in a narrower area than the latter.

Figure 3:
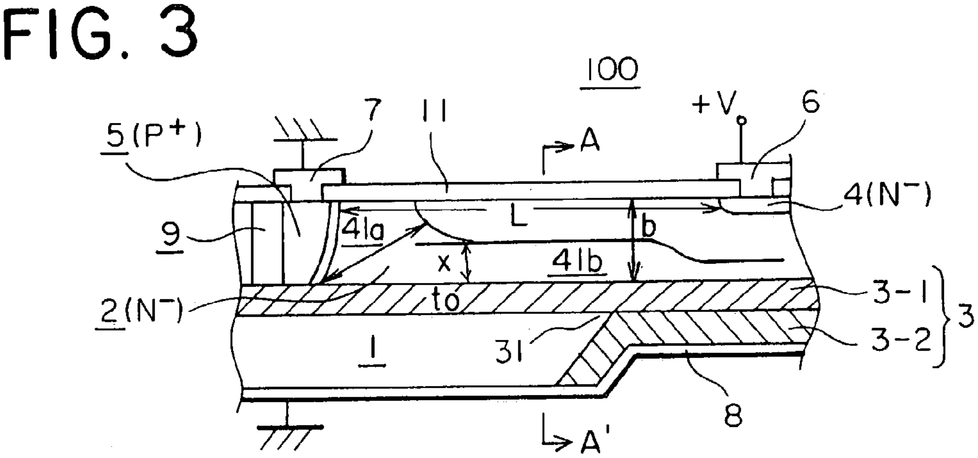
FIG. 3 is a sectional view for illustrating operation for holding a forward blocking voltage in the dielectric separation type semiconductor according to the first embodiment of the invention.
Figure 4:
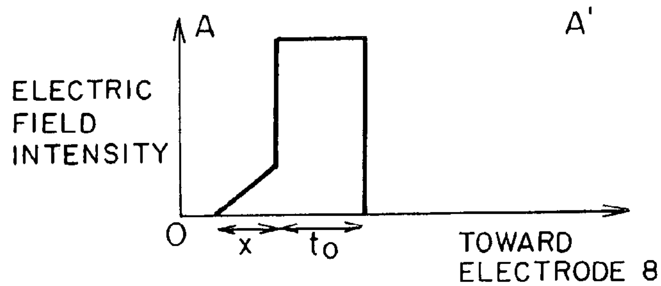
FIG. 4 is a view for illustrating a distribution of electric field intensity at a section indicated by a line A–A' in FIG. 3.

FIG. 3 is a sectional view for illustrating operation for holding a forward blocking voltage in the dielectric separation type semiconductor device 100 shown in FIGS. 1 and 2. Further, FIG. 4 is a view for illustrating a distribution of electric field intensity on a section taken along a line A–A' shown in FIG. 3.

Referring to FIG. 3, there are shown thickness $t_0$ of the first region (dielectric layer) 3-1, an edge 31 of the second region (dielectric layer) 3-2, depletion layers 41*a* and 41*b* making appearance in association with the $n^-$-type semiconductor layer 2, thickness x of the depletion layer 41*b*, and a distance L between the cathode electrode 6 and the anode electrode 7.

In the structure shown in FIG. 3, when both of the anode electrode 7 and the back-surface electrode 8 are set to the ground potential (0 (zero) volt) while applying to the cathode electrode 6 a positive or plus voltage (+V) which is gradually increased, then the depletion layer 41*a* extends from a pn junction formed between the $n^-$-type semiconductor layer 2 and the $p^+$-type semiconductor region 5.

In this case, the semiconductor substrate 1 serves as a field plate fixed to the ground potential through the interposed dielectric layer 3. Consequently, the depletion layer 41*b* extends from a boundary plane between the $n^-$-type semiconductor layer 2 and the dielectric layer 3 in the direction toward the top surface of the $n^-$-type semiconductor layer 2.

As a result of this, the electric field at the pn junction between the $n^-$-type semiconductor layer 2 and the $p^+$-type semiconductor region 5 is mitigated or reduced under the RESURF (Reduced Surface Field) effect mentioned hereinbefore.

Incidentally, the edge 31 of the second region 3-2 of the dielectric layer is set to a position distanced from the cathode electrode 6 by at least 40% of the distance L between the anode electrode 7 and the cathode electrode 6.

FIG. 4 shows a distribution of the electric field intensity at a location distanced sufficiently from the $p^+$-type semiconductor region 5 (section along the line A–A' shown in FIG. 3).

In FIG. 4, distance toward the back-surface electrode 8 is taken along the abscissa with the electric field intensity being taken along the ordinate. In FIG. 4, the top surface of the $n^-$-type semiconductor layer 2 is presumed as being located at the origin of the abscissa. Further, in FIG. 4, x represents the thickness (extension) of the depletion layer 41*b* and $t_0$ represents the thickness of the dielectric layer 3-1.

The total voltage drop at the section indicated by the line A–A' in FIG. 3 is given by the expression (3) mentioned previously in conjunction with the hitherto known dielectric separation type semiconductor device.

In other words, even for a same overall or total voltage drop, the extension x of the depletion layer 41*b* is reduced when the thickness $t_0$ of the dielectric layer 3 is increased, as a result of which the RESURF effect is mitigated.

On the other hand, under the conditions that no avalanche breakdown can take place due to the concentration of the electric field at the pn junction between the $n^-$-type semiconductor layer 2 and the $p^+$-type semiconductor region 5 and the concentration of the electric field at the interface between the $n^-$-type semiconductor layer 2 and the $n^+$-type semiconductor region 4, the blocking voltage V (i.e., the voltage withstanding capability, to say in another way) of the dielectric separation type semiconductor device 100 can ultimately be determined by the avalanche breakdown due to the concentration of the electric field at the interface between the $n^-$-type semiconductor layer 2 and the dielectric layer 3-1 immediately beneath the $n^+$-type semiconductor region 4.

In order to realize the semiconductor device 100 such that the conditions mentioned above can be satisfied, the distance L between the $p^+$-type semiconductor region 5 and the $n^+$-type semiconductor region 4 should be selected sufficiently long while optimizing the thickness d of the $n^-$-type semiconductor layer 2 and the impurity concentration N thereof.

By way of example, for ensuring the blocking voltage of 600 V, the distance L should preferably be so selected as to lie within a range of 70 $\mu$m to 100 $\mu$m.

Figure 5:
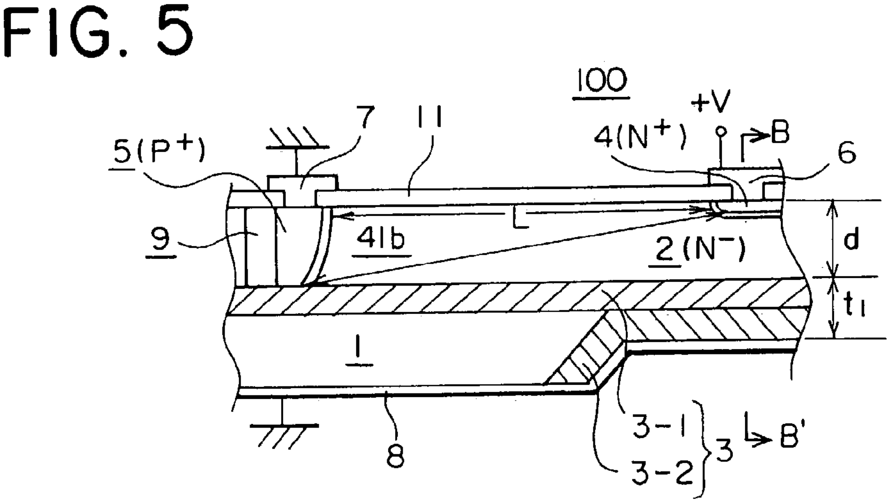
FIG. 5 is a sectional view for illustrating operation of the dielectric separation type semiconductor according to the first embodiment of the present invention under a blocking voltage condition.

FIG. 5 is a sectional view for illustrating the operation for holding the forward blocking voltage in the dielectric separation type semiconductor device 100 under the condition mentioned above.

In general, it is known that the condition mentioned above means that just when the deletion takes place from the interface between the $n^-$-type semiconductor layer 2 and the dielectric layer 3-1 toward the surface of the $n^-$-type semiconductor layer 2, the concentration of the electric field at the interface between the $n^-$-type semiconductor layer 2 and the dielectric layer 3-1 satisfies the avalanche condition.

FIG. 5 shows a state in which the depletion layer 41*b* has reached the $n^+$-type semiconductor region 4 and the allover depletion has occurred in the $n^-$-type semiconductor layer 2.

On the condition mentioned just above, the blocking voltage V can be represented by the total voltage drop at the location immediately beneath the $n^+$-type semiconductor region 4 (i.e., the section indicated by a line B–B' in FIG. 5) and can mathematically be expressed as follows:

$$V = Ecr \cdot (d/2 + \epsilon_2 \cdot t_1/\epsilon_3) \quad (8)$$

where $t_1$ represents the total thickness [cm] of the dielectric layer 3-1 and the dielectric layer 3-2 with the thickness of the $n^+$-type semiconductor region 4 being neglected.

Incidentally, the above expression (8) is equivalent to the expression (4) in which the thickness to is replaced by $t_1$.

Figure 6:
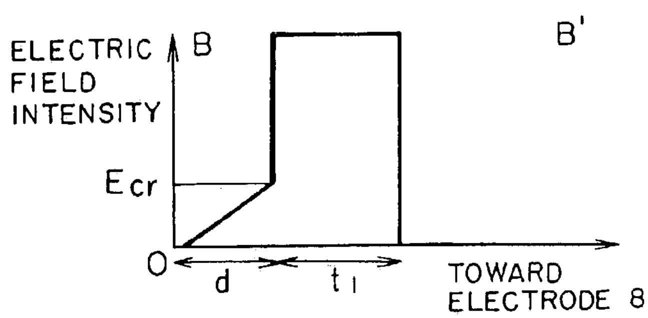
FIG. 6 is a view for illustrating a distribution of electric field intensity at a section indicated by a line B–B' indicated in FIG. 5.

FIG. 6 is a view for illustrating a distribution of the electric field intensity at the section indicated by the line B–B' in FIG. 5.

In FIG. 6, the electric field intensity at the boundary between the $n^-$-type semiconductor layer 2 and the dielectric layer 3 (i.e., the location distanced by the distance d from the origin toward the back-surface electrode 8) has reached the critical electric field intensity Ecr.

In other words, as can be seen from the expressions (3) and (8) mentioned previously, the blocking voltage (the voltage withstanding capability) can be increased when compared with the hitherto known device by setting the thickness to of the first dielectric layer 3-1 to be relatively small to thereby protect the RESURF effect against degradation while setting the thickness $t_1$ of the dielectric layer 3 to be relatively large in the range in which the second dielectric region 3-2 is formed.

Next, referring to FIGS. 7 to 10 which illustrates manufacturing steps or processes in sectional views, respectively, description will be made of a method of manufacturing the dielectric separation type semiconductor device according to the first embodiment of the present invention. Incidentally, in FIGS. 7 to 10, parts or components similar to those described hereinbefore by reference to FIGS. 1 to 3 and 5 are denoted by like reference symbols and repeated description in detail thereof will be omitted.

Figure 7:
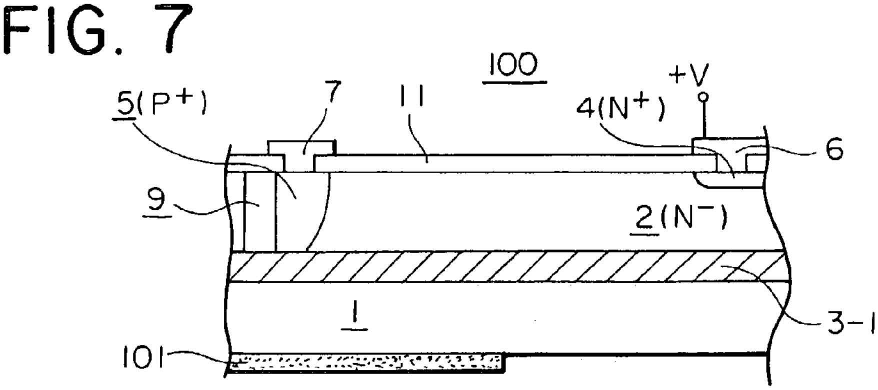
FIG. 7 is a sectional view for illustrating a step or process in a method of manufacturing the dielectric separation type semiconductor device according to the first embodiment of the present invention.

At first, referring to FIG. 7, it is presumed that in the dielectric separation type semiconductor device 100, a high-voltage device portion has been realized through a wafer process performed on an SOI (Silicon On Insulator) substrate in which the first dielectric region (3-1) of a relatively small thickness has been formed.

Starting from this state of the semiconductor device 100, an insulation film mask 101 (CVD-oxide film, CVD-nitride film, plasma-nitride film or the like) is formed on the back surface of the semiconductor substrate 1, as shown in FIG. 7.

The insulation film mask 101 is so formed as to match with the pattern on the major surface of the semiconductor device 100 (the surface of the $n^-$-type semiconductor layer 2) and is so aligned as to surround the cathode electrode 6. Incidentally, shown in FIG. 7 in section is only a half portion of the insulation film mask 101 which surrounds the cathode electrode 6 on one side.

Figure 8:
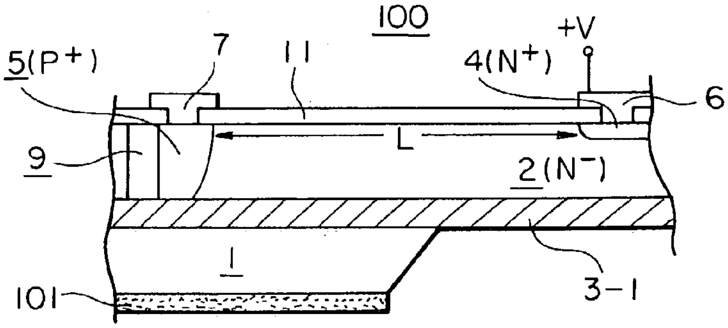
FIG. 8 is a sectional view for illustrating another process in the manufacturing method according to the first embodiment of the invention.

In succession, the semiconductor substrate 1 is etched through a KOH etching process in the apertured or opened region of the insulation film mask 101 deposited on the back surface to thereby expose the dielectric layer 3-1, as can be seen in FIG. 8.

In that case, the region occupied by the dielectric layer 3-1 which is exposed on the back side is so defined that the cathode electrode 6 is surrounded by the dielectric layer 3-1 and that the dielectric layer 3-1 is exposed around the cathode electrode 6 over an area whose radius is at least 40% of the distance L between the cathode electrode 6 and the anode electrode 7.

Figure 9:
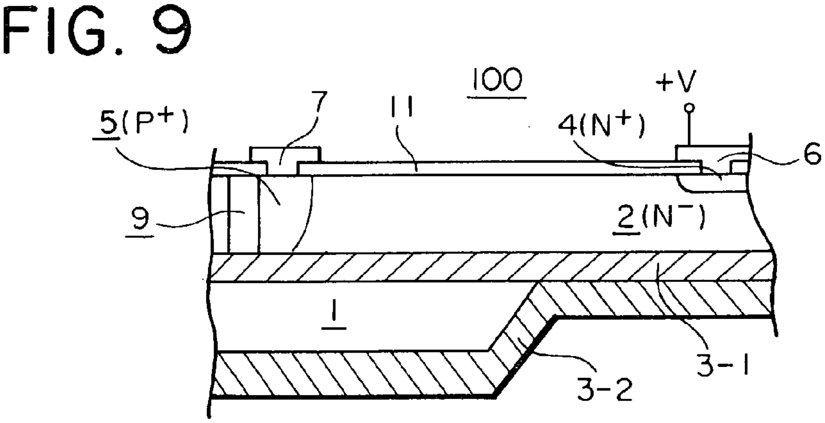
FIG. 9 is a sectional view for illustrating another process in the manufacturing method according to the first embodiment of the invention.
Figure 10:
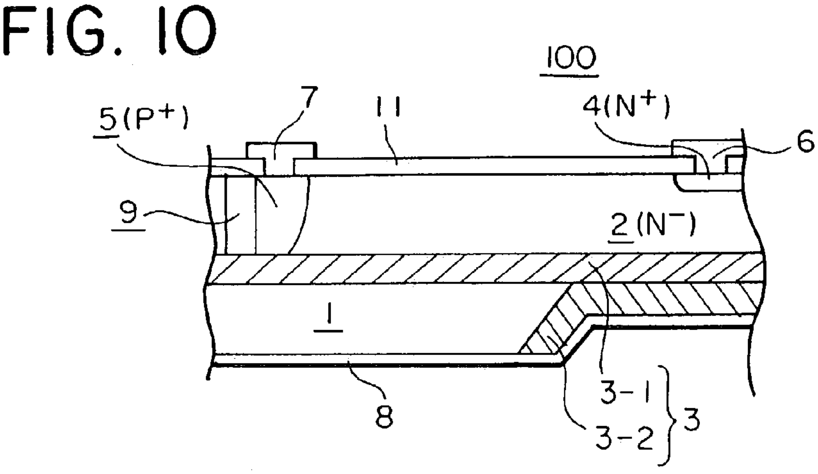
FIG. 10 is a sectional view for illustrating another process in the manufacturing method according to the first embodiment of the invention.

Subsequently, process of forming the dielectric layer 3-2 over the whole back surface of the semiconductor substrate 1 is carried out, as shown in FIG. 9. In more concrete, this step is performed as mentioned below.

Namely, application processes and a curing process are sequentially carried out with first PVSQ varnish of relatively low precision and second PVSQ varnish of relatively high precision to thereby form the film.

At this juncture, it should be mentioned that the dielectric layer 3-2 (second buried insulation film) is formed by a cured film of at least one curable polymer which is selected from a group consisting of silicone series polymer, polyimide series polymer, polyimide silicone series polymer, polyallylene ether series polymer, bis-benzo-cyclobutene series polymer, polychinoline series polymer, perfluoro hydrocarbon series polymer, fluorocarbon series polymer, aromatic hydrocarbon series polymer, borazine series polymer, and halides or deuterides of individual polymers mentioned above.

Alternatively, the dielectric layer 3-2 may be formed by a cured film of a silicone series polymer represented by the general formula mentioned below:

$$[Si(O_{1/2})_4]_k\cdot[R^1Si(O_{1/2})_3]_l\cdot[R^2R^3Si(O_{1/2})_2]_m\cdot[R^4R^5R^6SiO_{1/2}]_n \quad (1)$$

where $R^1$, $R^2$, $R^3$, $R^4$, $R^5$ and $R^6$ represent same or different aryl group, hydrogen group, aliphatic series alkyl group, trialkylsilyl group, deuterium group, deuteroalkyl group, fluorine group, fluoro-alkyl group or functional group having unsaturated bond, and k, l, m and n represent integers each greater than 0 (zero). Further, "2k+(3/2)l+m+(1/2)n" represents a natural number. Further, the mean molecular weight of each polymer is greater than "50" inclusive. Furthermore, molecular terminal groups are same or different aryl group, hydrogen group, aliphatic series alkyl group, hydroxyl group, trialkylsilyl group, deuterium group, deuteroalkyl group, fluorine group, fluoro-alkyl group or functional group having unsaturated bond.

Further, for preparing the first and second PVSQ varnish, polymers given by the undermentioned general formula (2) are taken into consideration.

(2)

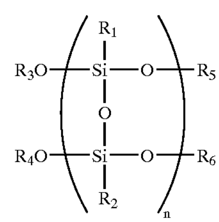

where $R_1$ and $R_2$ represent same or different aryl group, hydrogen group, aliphatic series alkyl group, hydroxyl group, deuterium group, deuteroalkyl group, fluorine group, fluoro-alkyl group or functional group having unsaturated bond. Further, $R_3$, $R_4$, $R_5$ and $R_6$ are same or different hydrogen group, aryl group, aliphatic series alkyl group, trialkylsilyl group, hydroxyl group, deuterium group, deuteroalkyl group, fluorine group, fluoro-alkyl group or functional group having unsaturated bond. Furthermore, n represents an integer, and the mean molecular weight of each polymer is greater than "50" inclusive.

At this juncture, it should be added that 95% of functional groups $R_1$ and $R_2$ is phenyl radical with 5% thereof being vinyl group or radical. On the other hand, all of $R_3$ to $R_6$ represent atomic hydrogen.

Silicone polymer (resin A) of 150 k in mean molecular weight which can be represented by the general formula (2) is solved in an anisole solution to prepare the first varnish of 10 wt % in solid concentration and the second varnish of 15 wt % in solid concentration, respectively, for carrying out sequentially the application process and the curing process.

More specifically, PVSQ of 150 k in molecular weight is solved by the anisole solution of 10 wt % to prepare the first varnish, while the second varnish is prepared by solving PVSQ of 150 k in molecular weight in the anisole solution of 15 wt %, whereon the varnish application processes are carried out at 100 rpm for 5 seconds, 300 rpm for 10 seconds and 500 rpm for 60 seconds. After the application processes, a curing process is executed by gradual cooling at a temperature of 350° C. for more than one hour.

In this manner, there can be formed in the apertured or opened region of the back surface of the semiconductor device 100 the dielectric layer 3-2 in which variation or unevenness of the film thickness has effectively been suppressed.

Further, by optimizing the dropping rate, it is also possible to control the film thickness optimally.

Finally, the whole back surface of the semiconductor device 100 is subjected to a polishing process to thereby eliminate the dielectric layer 3-2 formed on the semiconductor substrate 1, whereon the back-surface electrode 8 composed of a metal-evaporated layer (e.g. through evaporation of Ti, Ni and Au in three layers or the like process) is formed.

As a result of this, the dielectric layers 3-1 and 3-2 of the dielectric separation type semiconductor device 100 share a large proportion or part of the voltage drop in the first region (dielectric layer 3-1 of to in thickness) where the blocking voltage is to be determined, while in the second region (dielectric layer 3-2 of $t_1$ in thickness) which exerts influence to the RESURF effect, concentration of the electric field between the first semiconductor layer and the third semiconductor layer can be mitigated. Thus, the desired electric characteristics mentioned hereinbefore can be realized.

As is apparent from the above, the voltage withstanding capability of the dielectric separation type semiconductor device 100 can significantly be enhanced without impairing the RESURF effect according to the teachings of the invention incarnated in the embodiment described above. Besides, there has been proposed the method which is capable of manufacturing the dielectric separation type semiconductor device 100 with ease.

Further, by optimizing the film thicknesses of the primary dielectric layer 3-1 and the auxiliary dielectric layer 3-2 without altering or changing basically the structure of the SOI layer, significant enhancement of the voltage withstanding capability can be achieved.

Additionally, because no adverse influence is exerted to the other characteristics (e.g. turn-on current value, threshold voltage and the like), the so-called trade-off between the voltage withstanding capability and the other characteristics is no more required, which contributes to facilitation of designing the dielectric separation type semiconductor device.

Besides, by providing the auxiliary dielectric layer 3-2 over the area of 40% or more as described previously, the range in which the auxiliary dielectric layer 3-2 required for stabilizing the voltage withstanding characteristic is to be formed can definitely be determined. Thus, there will arise no fear that the mechanical strength of the device might be deteriorated by enlarging unnecessarily the auxiliary dielectric layer 3-2.

Moreover, since the auxiliary dielectric layer 3-2 is realized in a cylindrical form having a bottom (bowl-like shape) and bonded or junctioned to both the primary dielectric layer 3-1 and the semiconductor substrate 1, the adhesive strength can be increased, which contributes to stabilization of the voltage withstanding characteristic and extension of the life of the semiconductor device. In particular, in the case where the auxiliary dielectric layer 3-2 is formed by the PVSQA film, occurrence of cracks at the boundary regions between the auxiliary dielectric layer 3-2 on one hand and the primary dielectric layer 3-1 and the semiconductor substrate 1 on the other hand, respectively, can be avoided. Thus, the dielectric layer which is stabilized mechanically and electrically can be realized.

Additionally, use of PVSQ can facilitate control of the thickness of the film as formed, advantageously for the manufacturing process.

Embodiment 2

In conjunction with the first embodiment of the present invention, no consideration has been paid to the process of forming the semiconductor device 100 shown in FIG. 7. A second embodiment of the present invention is directed to a method of manufacturing the semiconductor device 100 by forming the dielectric layers 3-1, respectively, on both surfaces of the active layer substrate, implanting nitrogen into the major surface of the active layer substrate, bonding the semiconductor substrate 1 composed of a pedestal silicon and forming an electrode pattern.

In the following, description will be made of a method of manufacturing the dielectric separation type semiconductor device 100 by bonding the pedestal silicon substrate onto the active layer substrate after the nitrogen implantation according to the second embodiment of the invention by reference to FIGS. 11 to 13 which illustrates in sectional views the processes or steps involved in this method.

Figure 11:
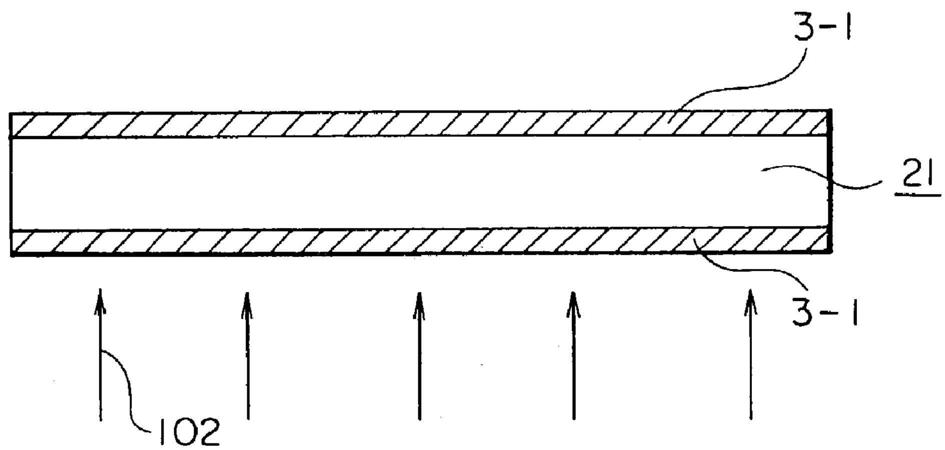
FIG. 11 is a sectional view for illustrating a step or process in a method of manufacturing a dielectric separation type semiconductor device according to a second embodiment of the present invention.
Figure 12:
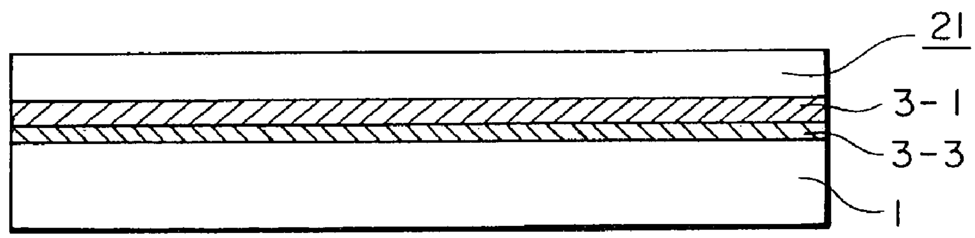
FIG. 12 is a sectional view for illustrating another process in the semiconductor device manufacturing method according to the second embodiment of the invention.
Figure 13:
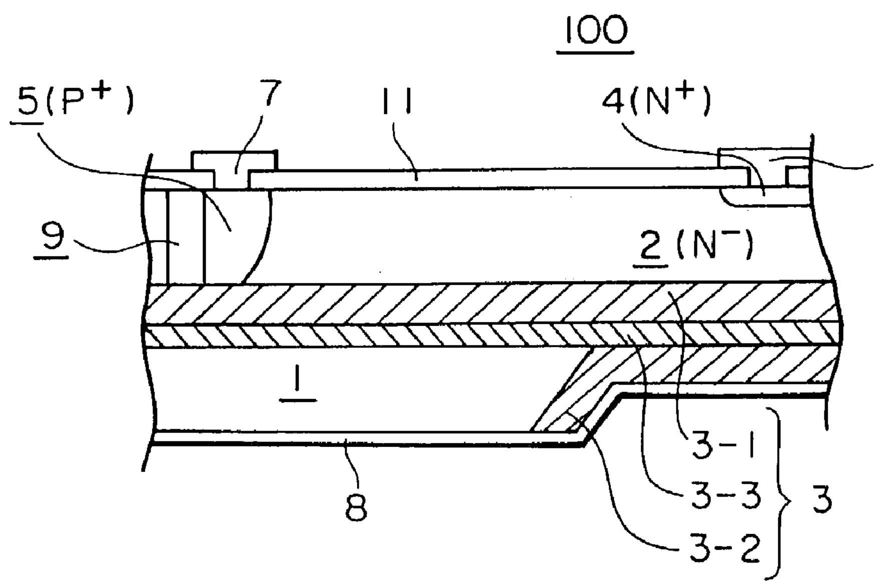
FIG. 13 is a sectional view for illustrating another process in the manufacturing method according to the second embodiment of the invention.

Incidentally, in FIGS. 11 to 13, parts or components similar to those described herein before are denoted by like reference symbols and repeated description in detail thereof will be omitted.

At first, reference is made to FIG. 11. Dielectric layers 3-1 each constituted by an oxide film are formed on both surfaces of the active layer substrate 21 in precedence to fabrication of the bonded SOI substrate, whereon nitrogen implantation (see arrows 102 in FIG. 11) is performed in one major surface onto which the semiconductor substrate 1 is to be bonded, as described later on.

In succession, the semiconductor substrate 1 composed of silicon pedestal is bonded onto the major surface of the active layer substrate 21 into which nitrogen has been implemented, as shown in FIG. 12.

At this stage, an annealing treatment may be carried out at a sufficiently high temperature, e.g. at 1200° C. or more to thereby stabilize the major surface of the active layer substrate 21 (i.e., nitrogen implanted region) by forming a nitrogen oxide film layer 3—3, whereon the other major surface of the active layer substrate 21 is polished to control the thickness of the active layer substrate 21 to a desired value.

In this way, there can be realized the SOI substrate constituted by the active layer substrate 21 and the semiconductor substrate 1 bonded together.

Subsequently, the wafer process similar to that described previously in conjunction with the first embodiment of the invention is performed on the SOI substrate shown in FIG. 12, whereon various elements inclusive of the high voltage withstanding device (high block voltage device) are formed internally of the active layer substrate 21, as is shown in FIG. 13. Thereafter, opening is formed in the back surface through KOH etching process.

In that case, owing to the presence of the buried dielectric layer constituted by the nitrogen oxide film 3—3, it is possible to prevent the dielectric layer 3-1 formed of the oxide film from being diminished through the KOH etching process. By way of example, assuming that the semiconductor substrate 1 is etched on the condition that a KOH solution of 30% is employed at the ambient temperature of 60° C., then the etching rates for silicon, oxide film and nitrogen oxide film are, respectively, 40 $\mu$m/hour, 0.13 $\mu$m/hour and 0.01 $\mu$m/hour. Accordingly, the effect of the etching can be predicted.

By the way, in order to mitigate the stress to which the semiconductor substrate 1 is subjected, it is desirable to form the dielectric layer 3-1 in a relatively small thickness, as mentioned hereinbefore in conjunction with the first embodiment of the invention. Besides, it goes without saying that uneven thinning of the film due to nonuniformity of the KOH etching should be suppressed to a possible minimum.

After the dielectric layer 3-1 and the nitrogen oxide film layer 3—3 have been exposed without being accompanied with any appreciable loss, the process or steps similar to those described previously by reference to FIG. 10 are executed to finish the semiconductor device which is capable of withstanding a high voltage (i.e., high blocking voltage rated device), as shown in FIG. 13.

Thus, the electrical characteristics similar to those described hereinbefore can be realized.

Further, by providing additionally the auxiliary dielectric layer 3—3, variation in the film thickness of the primary dielectric layer 3-1 taking place in the course of the manufacturing processes can be suppressed, whereby the desired voltage withstanding characteristic can be ensured by realizing the film thickness as designed.

Embodiment 3

In the method of manufacturing the dielectric separation type semiconductor device according to the second embodiment of the invention, the semiconductor substrate 1 is bonded to the active layer substrate 21 after the nitrogen implantation. A third embodiment of the invention is directed to a method of manufacturing the dielectric separation type semiconductor device 100 by bonding the active layer substrate 21 onto the semiconductor substrate 1 after having formed a dielectric layer on the semiconductor substrate by a thermally nitrided film or a CVD nitride film.

In the following, referring to FIGS. 14 to 16, description will be made of the method of manufacturing the dielectric separation type semiconductor device 100 by bonding the active layer substrate 21 onto the semiconductor substrate 1 after having formed on the semiconductor substrate 1 a thermally nitrided film or a CVD nitride film (dielectric layer) according to the third embodiment of the present invention.

Figure 14:
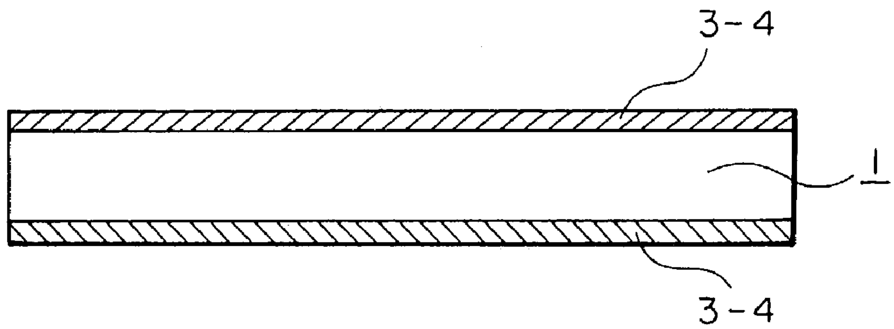
FIG. 14 is a sectional view for illustrating a step or process in a method of manufacturing a dielectric separation type semiconductor device according to a third embodiment of the present invention.
Figure 15:
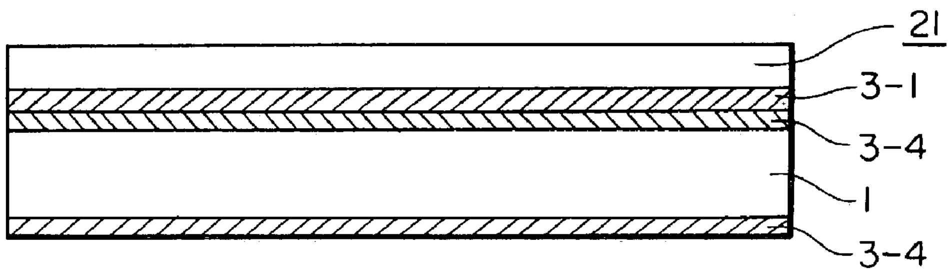
FIG. 15 is a sectional view for illustrating another process in the semiconductor device manufacturing method according to the third embodiment of the invention.
Figure 16:
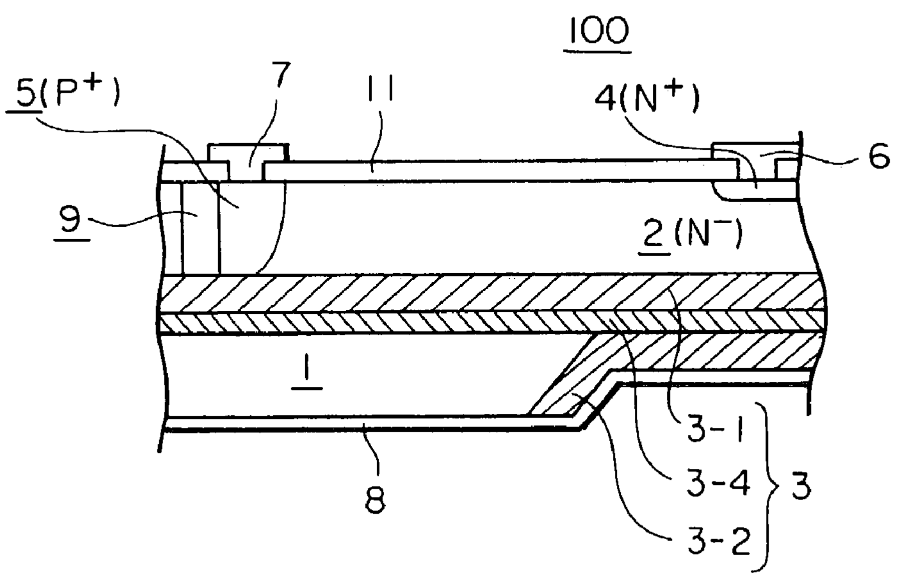
FIG. 16 is a sectional view for illustrating another process in the manufacturing method according to the third embodiment of the invention.

Incidentally, in FIGS. 14 to 16, parts or components similar to those described hereinbefore are denoted by like reference symbols and repeated description in detail thereof will be omitted.

At first, referring to FIG. 14, the dielectric layers 3-4 each constituted by a thermally nitrided film or a CVD nitride film are formed, respectively, on both surfaces of the semiconductor substrate 1 constituted by the silicon pedestal in precedence to fabrication of the bonded SOT substrate.

In succession, the semiconductor substrate 1 shown in FIG. 14 is bonded onto the major surface of the active layer substrate 21 on which the dielectric layer 3-1 has previously been formed by an oxide film, to thereby integrate unitarily the semiconductor substrate 1 and the active layer substrate 21.

At this stage, the other major surface of the active layer substrate 21 is polished to thereby control the thickness of the active layer substrate 21 to a desired value. Through this additional process, the SOT substrate shown in FIG. 15 is fabricated.

Finally, the wafer process similar to that described previously in conjunction with the first embodiment of the invention is performed on the SOI substrate shown in FIG. 15, whereon various devices inclusive of the voltage withstanding device (high blocking voltage rated device) are formed, as is shown in FIG. 16. Thereafter, the back surface is etched through KOH etching process to thereby realize the dielectric separation type semiconductor device 100.

In that case, because of the presence of the buried dielectric layer constituted by the dielectric layer 3-4 formed by the nitride film, it is possible to prevent the dielectric layer 3-1 formed of the oxide film from being diminished through the KOH etching process, as described hereinbefore in conjunction with the second embodiment of the invention.

After the dielectric layers 3-1 and 3-4 have been exposed without being accompanied with any appreciable loss, the processes similar to those described previously by reference to FIG. 10 are carried out to finish the semiconductor device capable of withstanding a high voltage (i.e., high blocking voltage rated device) shown in FIG. 16.

Thus, the electrical characteristics similar to those described hereinbefore can be realized.

Further, by providing additionally another auxiliary dielectric layer 3-4 constituted by the thermally nitrided film or CVD nitride film, variation or unevenness in the film thickness of the primary dielectric layer 3-1 which may otherwise occur in the course of the manufacturing process can be suppressed, as described hereinbefore, whereby the desired voltage withstanding characteristic can be ensured while realizing the film thickness as designed.

Embodiment 4

In the case of the first to third embodiments of the invention, the bowl-like opened region is formed by eliminating partially the semiconductor substrate 1 on the side of the back surface of the semiconductor device 100. A fourth embodiment of the present invention is directed to a method of manufacturing the dielectric separation type semiconductor device 100 in which a cylindrical opened region having a vertical side wall is formed by resorting to a high-speed silicon dry etching process.

In the following, referring to FIGS. 17 to 19 together with FIG. 7 mentioned hereinbefore, description will be made of the method of manufacturing the dielectric separation type semiconductor device 100 by forming a cylindrical opened or apertured region having a bottom in the semiconductor substrate 1 according to the fourth embodiment of the present invention.

Figure 17:
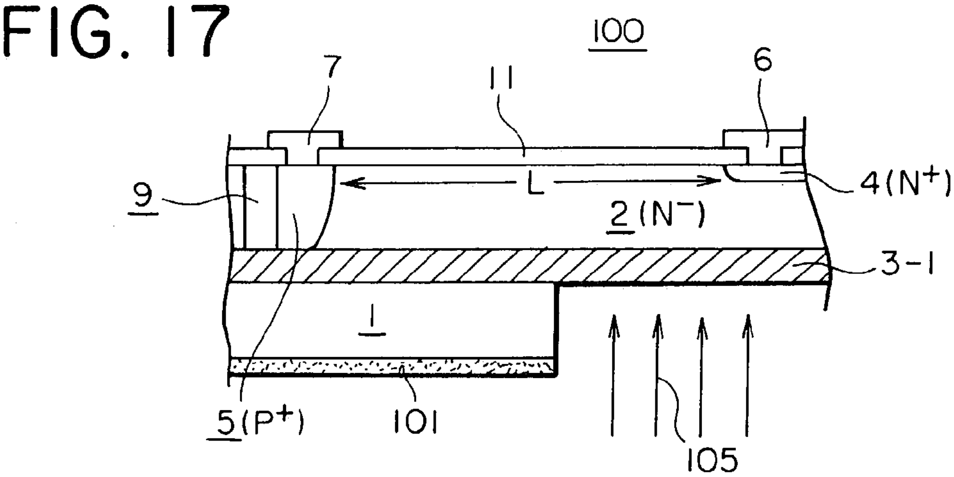
FIG. 17 is a sectional view for illustrating a step or process in a method of manufacturing a dielectric separation type semiconductor device according to a fourth embodiment of the present invention.
Figure 18:
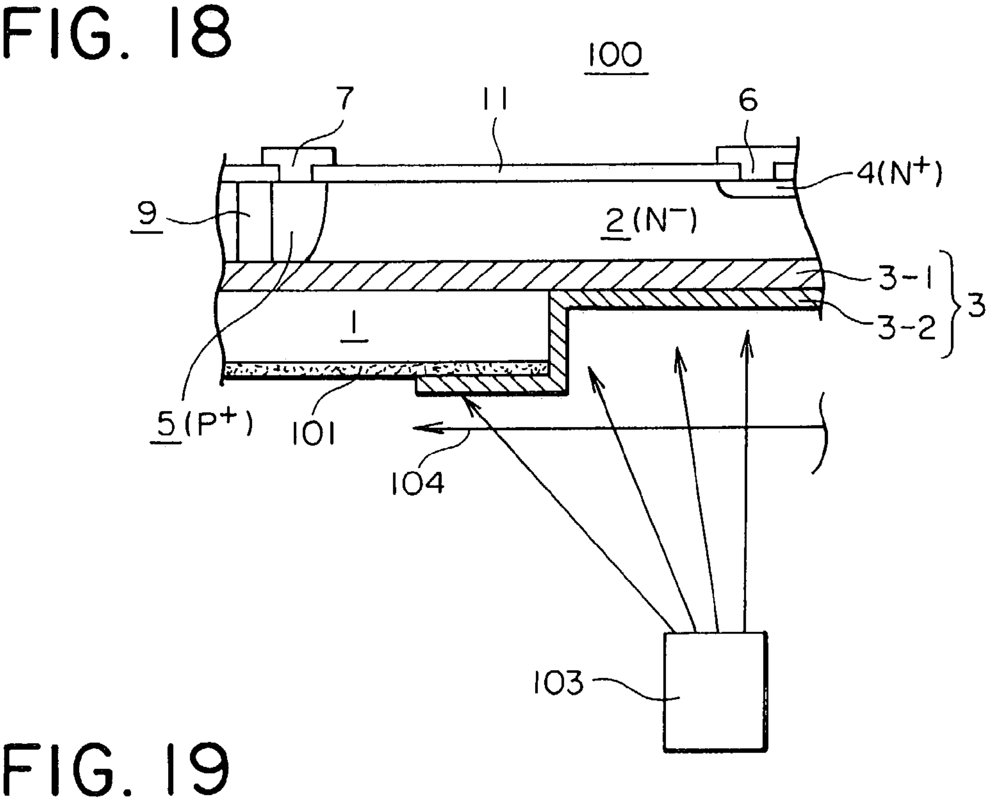
FIG. 18 is a sectional view for illustrating another process in the semiconductor device manufacturing method according to the fourth embodiment of the invention.
Figure 19:
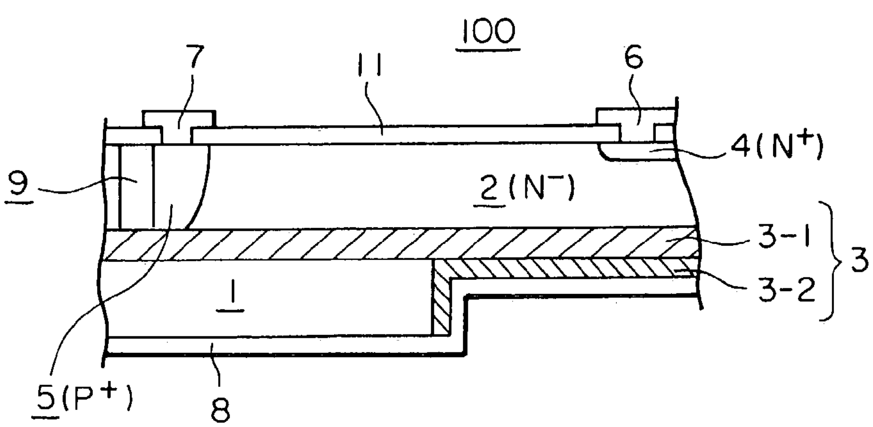
FIG. 19 is a sectional view for illustrating another process in the manufacturing method according to the fourth embodiment of the invention.

Incidentally, in FIGS. 17 to 19, parts or components similar to those described herein before are denoted by like reference symbols and repeated description in detail thereof will be omitted.

At first, it is presumed that in the dielectric separation type semiconductor device 100, the insulation film mask 101 is formed on the back surface of the semiconductor substrate 1 such that the cathode electrode 6 is covered and surrounded by the opened region of the insulation film mask 101. Further, it is also presumed that the region occupied by the opened region is so determined that the dielectric layer 3-1 is exposed around the cathode electrode 6 over an area whose radius is at least 40% of the distance L (see FIG. 8) between the cathode electrode 6 and the anode electrode 7.

Next, a high-speed silicon dry etching process is carried out from the back surface of the semiconductor substrate 1, as indicated by arrows 105 in FIG. 17, to thereby eliminate the opened or exposed region of the semiconductor substrate 1 which serves as a base or pedestal substrate, as shown in FIG. 17.

In succession, the dielectric layer 3-2 constituted by an A-resin film is selectively formed in the opened region and a peripheral region thereof by a spray coating machine 103 (or through a scan coating method using a micro-nozzle), as illustrated in FIG. 18.

In that case, the area of the region 104 to be coated by the spray coating machine 103 (see the region indicated by the arrow 104) is so selectively determined that the area mentioned above is less than five times as large as the area of the apertured or opened region (100 μm to 300 μm). Further, after the dielectric layer 3-2 has been applied, the curing process is performed as described hereinbefore in conjunction with the first embodiment of the invention.

Subsequently, the back surface of the semiconductor substrate 1 is polished to remove the insulation film mask 101 and the dielectric layer (A-resin film) 3-2 formed on the major surface of the semiconductor substrate 1. Thereafter, the back-surface electrode 8 is newly formed over the back surface through evaporation, as illustrated in FIG. 19.

Also in the dielectric separation type semiconductor device 100 in which the cylindrical opened portion having the bottom is formed on the side of the back surface, the electric characteristics or effects similar to those mentioned hereinbefore can be realized.

Further, because the additional auxiliary dielectric layer 3-2 is formed, variation or unevenness in the film thickness of the primary dielectric layer which may otherwise occur in the course of the manufacturing process can be suppressed, as described hereinbefore, whereby the desired voltage withstanding characteristic can be ensured while realizing the film thickness as designed.

Embodiment 5

In the case of the fourth embodiment described above, the back surface of the semiconductor substrate 1 is polished after formation of the opened region. In a method of manufacturing the dielectric separation type semiconductor device 100 according to a fifth embodiment of the present invention, the back surface of the semiconductor substrate 1 is irradiated with high-energy ions before forming the opened or apertured region to thereby form a crystallinity-destructed silicon layer as a delaminatable layer internally of the semiconductor substrate 1 so that the back surface portion of the semiconductor substrate 1 can be delaminated after formation of the opened region.

Figure 20:
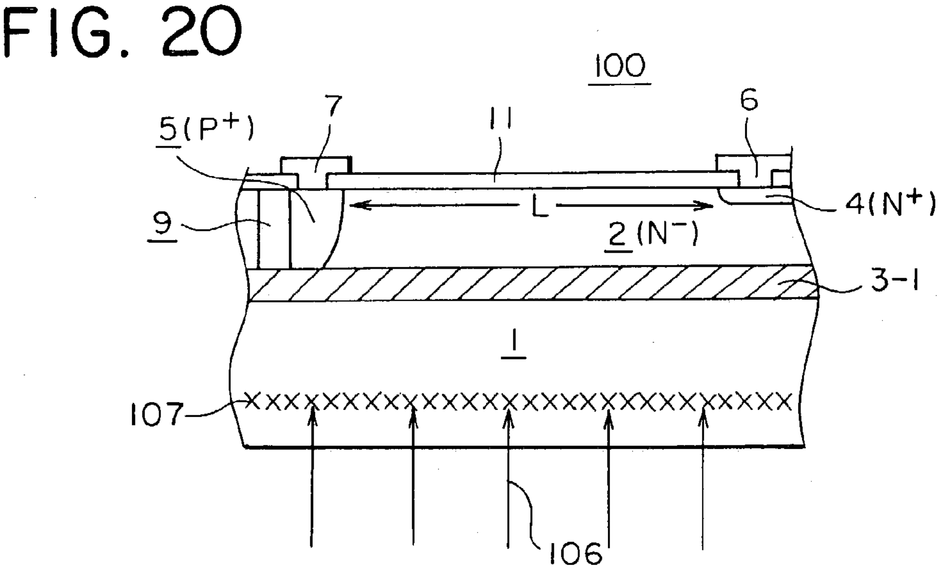
FIG. 20 is a sectional view for illustrating a step or process in a method of manufacturing a dielectric separation type semiconductor device according to a fifth embodiment of the present invention.
Figure 21:
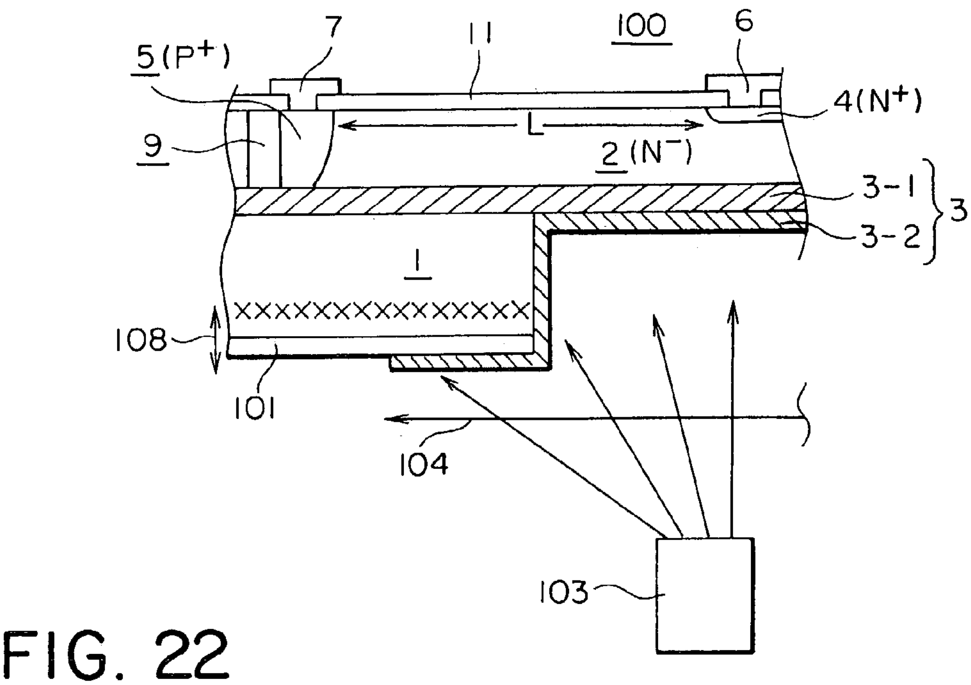
FIG. 21 is a sectional view for illustrating another process in the semiconductor device manufacturing method according to the fifth embodiment of the invention.
Figure 22:
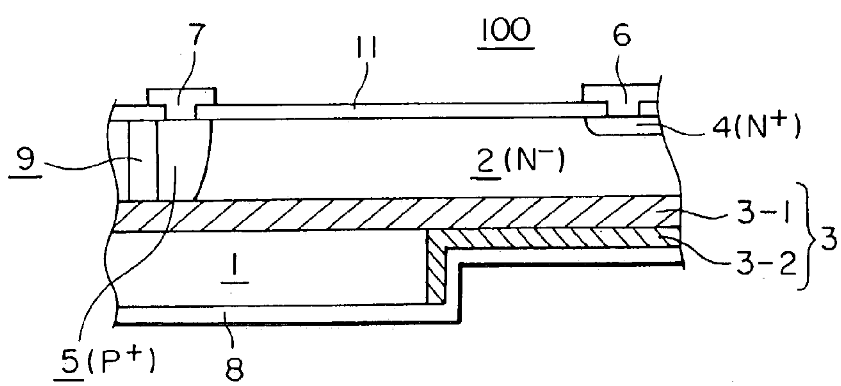
FIG. 22 is a sectional view for illustrating another process in the manufacturing method according to the fifth embodiment of the invention.

In the following, referring to FIGS. 20 to 22 showing processes or steps in sectional views, respectively, together with FIGS. 7 and 17 mentioned hereinbefore, description will be made of the method of manufacturing the dielectric separation type semiconductor device 100 in which the opened region is formed after formation of the delaminatable layer internally of the semiconductor substrate 1 so that the back surface portion of the semiconductor substrate 1 can be delaminated.

Incidentally, in FIGS. 20 to 22, parts or components similar to those described herein before are denoted by like reference symbols and repeated description in detail thereof will be omitted.

Referring to FIG. 20, the semiconductor device 100 is firstly irradiated with high-energy ions (e.g. hydrogen ions) 106 from the back surface before the insulation film mask 101 is formed to thereby form a crystallinity-destructed silicon layer 107 in which crystallinity of silicon is destructed in a region lying internally of the semiconductor substrate at a predetermined depth from the back surface.

In succession, the insulation film mask 101 is formed on the back surface of the semiconductor device 100. In that case, the opened region of the insulation film mask 101 is so formed as to surround the cathode electrode 6. Further, the region occupied by the opened region is so determined that the dielectric layer 3-1 is exposed around the cathode electrode 6 over an area whose radius is at least 40% of the distance L between the cathode electrode 6 and the anode electrode 7.

Subsequently, by carrying out a high-speed silicon dry etching process from the back surface of the semiconductor substrate 1 to thereby eliminate the material of the semiconductor substrate 1 in the opened or exposed region, as illustrated in FIG. 17.

In succession, the dielectric layer 3-2 constituted by the A-resin film is selectively formed in the opened region and a peripheral region thereof by a spray coating machine 103, as illustrated in FIG. 21.

In that case, the area of the region 104 to be coated by the spray coating machine 103 is so selectively determined that the area mentioned above is less than five times as large as the area of the opened region (100 μm to 300 μm). After completion of the application of the dielectric layer 3-2, the curing process is performed.

Thereafter, the back surface region 108 is delaminated en bloc by making use of the crystallinity-destructed silicon layer 107 which is formed as the delaminatable layer, to thereby remove the insulation film mask 101 and the dielectric layer (A-resin film) 3-2 formed on the semiconductor substrate 1 (pedestal substrate). Further, after polishing process, the back-surface electrode 8 is newly formed on the whole back surface through evaporation, as illustrated in FIG. 22.

In this manner, the electric characteristics and effects similar to those mentioned hereinbefore can be realized.

Embodiment 6

In the case of the fifth embodiment of the invention, the semiconductor device 100 is irradiated with the high-energy ions 106 from the back surface side thereof to form the crystallinity-destructed silicon layer 107. By contrast, according to a sixth embodiment of the present invention, a breach region is provided in the buried insulation film (dielectric layer) formed internally of the semiconductor substrate, wherein an anodizing current is fed from the side of the front or top surface of the semiconductor device 100 to thereby form a porous silicon layer in the semiconductor substrate in place of the crystallinity-destructed silicon layer 107.

Figure 23:
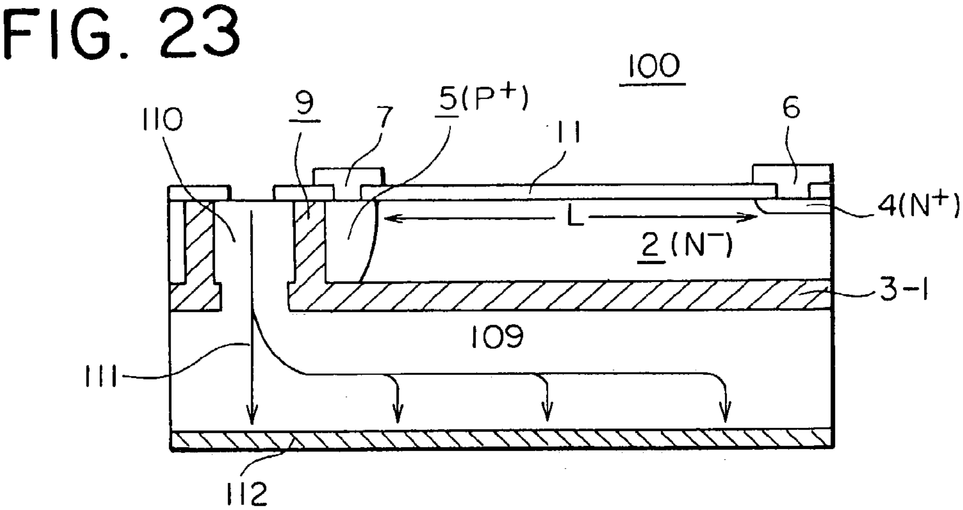
FIG. 23 is a sectional view for illustrating a step or process in a method of manufacturing a dielectric separation type semiconductor device according to a sixth embodiment of the present invention.
Figure 24:
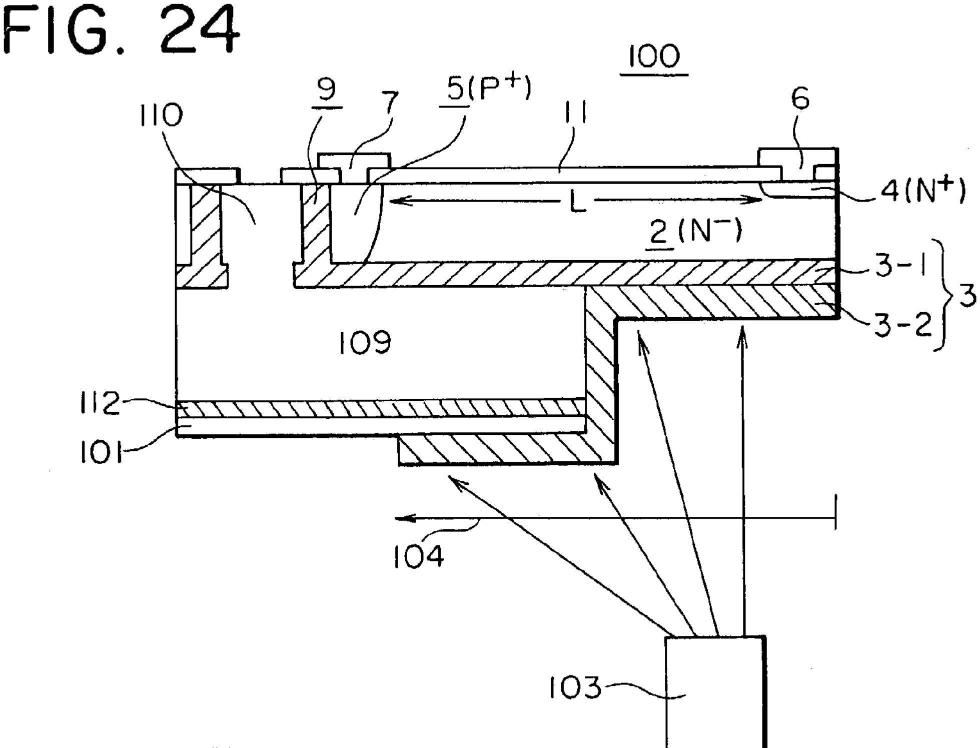
FIG. 24 is a sectional view for illustrating another process in the semiconductor device manufacturing method according to the sixth embodiment of the invention.
Figure 25:
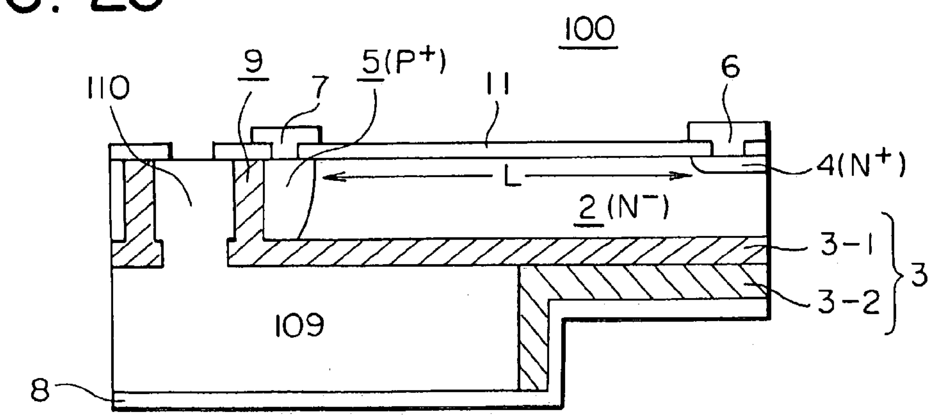
FIG. 25 is a sectional view for illustrating another process in the manufacturing method according to the sixth embodiment of the invention.

In the following, referring to FIGS. 23 to 25 showing processes in sectional views, respectively, together with FIGS. 7 and 17 mentioned hereinbefore, description will be made of the method of manufacturing the dielectric separation type semiconductor device 100 according to the sixth embodiment of the present invention in which the porous silicon layer 112 is formed as a delaminatable layer internally of the semiconductor substrate 109.

Incidentally, in FIGS. 20 to 22, parts or components similar to those described herein before are denoted by like reference symbols and repeated description in detail thereof will be omitted.

Additionally, a semiconductor substrate 109 corresponds to the semiconductor substrate 1 described heretofore and is constituted by a p-type substrate.

At first, referring to FIG. 23, in the SOI substrate including the semiconductor substrate 109 as the base or pedestal, a breach region is provided as a part of the buried insulation film (dielectric layer) 3-1 formed internally of the semiconductor device 100 in advance. A p-type active region 110 which is in contact with the semiconductor substrate 109 via the breach region of the dielectric layer 3-1 is surrounded by a trench-isolated region (insulation film) 9, being isolated from the $n^-$-type semiconductor layer (SOI active layer) 2.

Further, in FIG. 23, wafer process is performed on the SOI substrate to form the semiconductor elements primarily in the SOI active layer 2, whereon an anodizing current 111 is caused to flow from the p-type active region 110 toward the semiconductor substrate 109 (see arrows). Through this process, a porous silicon layer 112 which is to serve as the delaminatable layer (described hereinafter) is formed on a major plane located near to the back surface of the semiconductor substrate 109.

Next, the insulation film mask 101 is so formed as to surround the cathode electrode 6 on the porous silicon layer 112, as shown in FIG. 7. In that case, the area occupied by the opened region of the insulation film mask 101 is so determined that the dielectric layer 3-1 is exposed around the cathode electrode 6 over an area whose radius is at least 40% of the distance L between the cathode electrode 6 and the anode electrode 7, as described previously.

In succession, a high-speed silicon dry etching process is carried out from the back surface of the semiconductor substrate 109, to thereby eliminate the semiconductor substrate 109, as shown in FIG. 17.

In succession, the A-resin film 3-2 is selectively formed in the opened region and a peripheral region thereof by employing the spray coating machine 103, as shown in FIG. 24.

In that case, the area of the region 104 of the A-resin film 3-2 to be coated by the spray coating machine 103 is so selectively determined that the area mentioned above is less than five times as large as that of the opened region (100 μm to 300 μm). Further, after the A-resin film 3-2 has been applied, the curing process is performed as described hereinbefore.

Subsequently, the back surface region of the semiconductor substrate 109 is delaminated en bloc by making use of the porous silicon layer 112 serving as the delaminatable layer to thereby remove the insulation film mask 101 and the A-resin film 3-2 formed on the major surface of the semiconductor substrate 109. Further, after the polishing process, the back-surface electrode 8 is newly formed over the back surface through evaporation (FIG. 25).

In this manner, the electric characteristics or effects similar to those mentioned hereinbefore can be realized.

Embodiment 7

In the case of the fifth embodiment (FIGS. 20 to 22) described above, the dielectric layer (A-resin film) 3-2 is formed by using the spray coating machine 103 after formation of the opened region. In the semiconductor device manufacturing method according to a seventh embodiment of the present invention, the dielectric layer 3-2 formed of a thick CVD oxide film is formed by resorting to a high-speed CVD deposit process.

Figure 26:
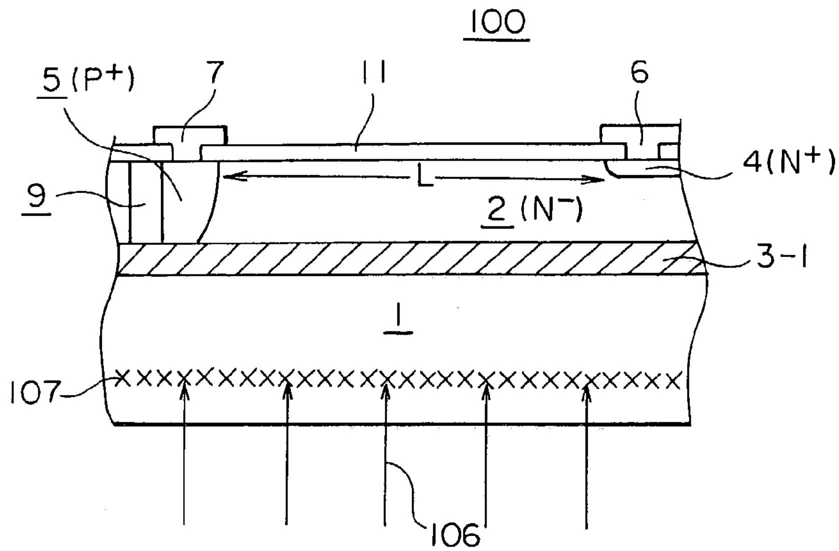
FIG. 26 is a sectional view for illustrating a step or process in a method of manufacturing a dielectric separation type semiconductor device according to a seventh embodiment of the present invention.
Figure 27:
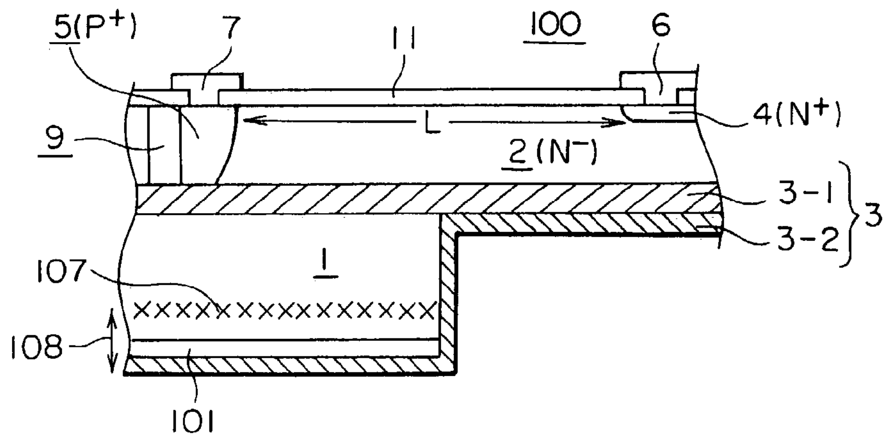
FIG. 27 is a sectional view for illustrating another process in the semiconductor device manufacturing method according to the seventh embodiment of the invention.
Figure 28:
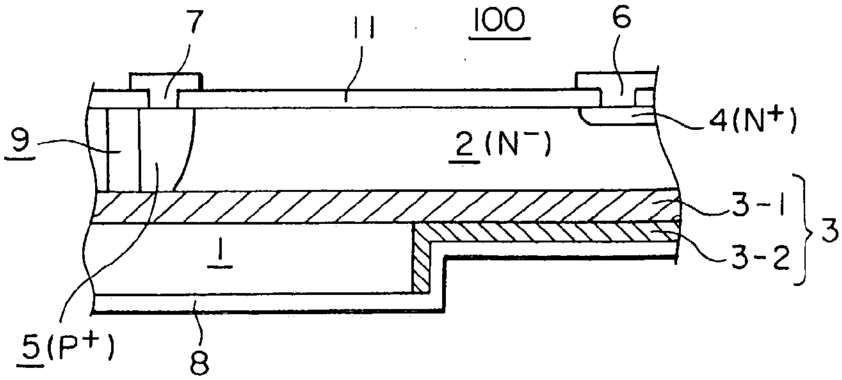
FIG. 28 is a sectional view for illustrating another process in the manufacturing method according to the seventh embodiment of the invention.

In the following, referring to FIGS. 26 to 28 showing manufacturing processes in sectional views, respectively, together with FIGS. 7 and 17 mentioned hereinbefore, description will be made of the method of manufacturing the dielectric separation type semiconductor device 100 according to the seventh embodiment of the present invention in which a CVD oxide film (dielectric layer) 3-2 is formed through a high-speed CVD deposit process on the opened region and the peripheral region thereof.

Incidentally, FIGS. 26 to 28 correspond to FIGS. 20 to 22 mentioned previously. In FIGS. 26 to 28, parts or components similar to those described hereinbefore are denoted by like reference symbols and repeated description in detail thereof will be omitted.

Referring to FIG. 26, the semiconductor device 100 is firstly irradiated with high-energy ions (e.g. hydrogen ions) 106 from the back surface to thereby form a crystallinity-destructed silicon layer 107 in which crystallinity of silicon is destructed in a region lying internally of the semiconductor substrate 1 at a predetermined depth from the back surface.

In succession, the insulation film mask 101 is so formed as to surround the cathode electrode 6 on the back surface of the semiconductor device 100, as shown in FIG. 7. Further, the region occupied by the opened region of the insulation film mask 101 is exposed around the cathode electrode 6 over an area whose radius is at least 40% of the distance L between the cathode electrode 6 and the anode electrode 7.

Subsequently, by carrying out a high-speed silicon dry etching process from the back surface of the semiconductor device 100, the material of the semiconductor substrate 1 is eliminated or removed to thereby form the opened region, as shown in FIG. 17.

In succession, the dielectric layer 3-2 of the thick CVD oxide film is formed through the high-speed CVD deposit process, as shown in FIG. 27.

Subsequently, the back surface region 108 is delaminated en bloc by making use of the crystallinity-destructed silicon layer 107 serving as the delaminatable layer to thereby remove the insulation film mask 101 and the CVD oxide film (dielectric layer) 3-2 formed on the major surface of the semiconductor substrate 1. Further, after polishing process, the back-surface electrode 8 is newly formed over the back surface through evaporation, as shown in FIG. 28.

In this manner, the electric characteristics or effects similar to those mentioned hereinbefore can be realized.

Embodiment 8

In the case of the sixth embodiment (FIGS. 23 to 25) described above, the dielectric layer (A-resin film) 3-2 is formed by using the spray coating machine 103 after formation of the opened region. In the semiconductor device manufacturing method according to an eighth embodiment of the present invention, the dielectric layer 3-2 formed of a thick CVD oxide film is realized by resorting to a high-speed CVD deposit process.

Figure 29:
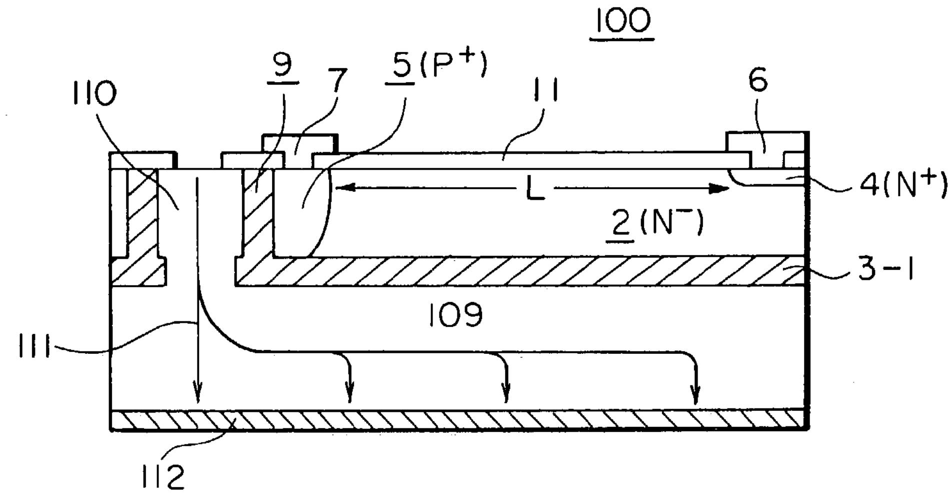
FIG. 29 is a sectional view for illustrating a step or process in a method of manufacturing a dielectric separation type semiconductor device according to an eighth embodiment of the present invention.
Figure 30:
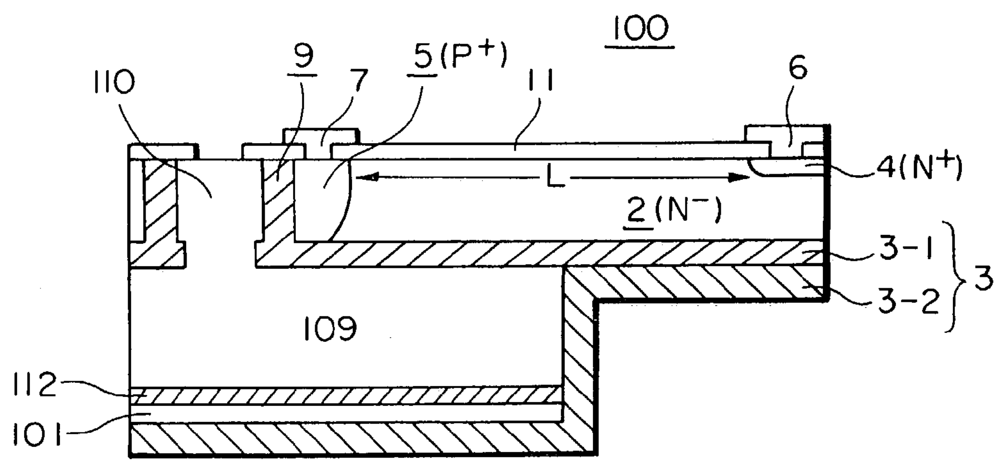
FIG. 30 is a sectional view for illustrating another process in the semiconductor device manufacturing method according to the eighth embodiment of the invention.
Figure 31:
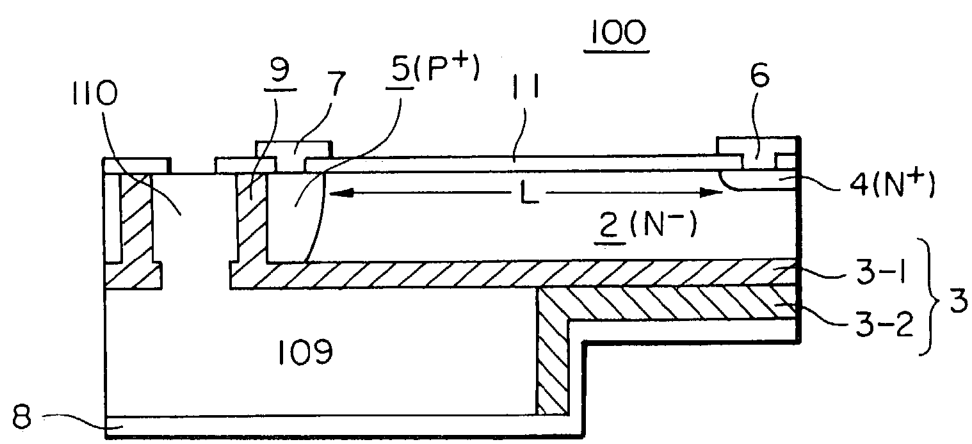
FIG. 31 is a sectional view for illustrating another process in the manufacturing method according to the eighth embodiment of the invention.
Figure 32:
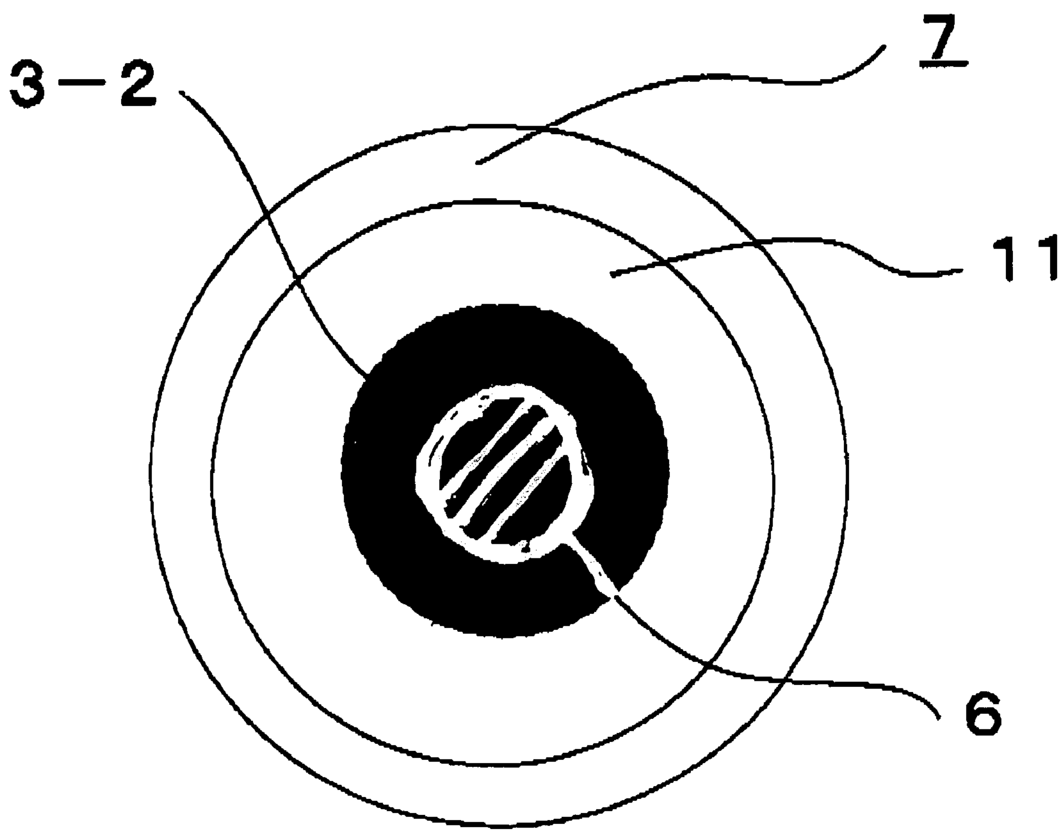

In the following, referring to FIGS. 29 to 31 showing manufacturing processes in sectional views, respectively, together with FIGS. 7 and 17 mentioned hereinbefore, description will be made of the method of manufacturing the dielectric separation type semiconductor device 100 accord ing to the eighth embodiment of the present invention in which a CVD oxide film (dielectric layer) 3-2 is formed through the high-speed CVD deposit process on the opened region and the peripheral region thereof.

Incidentally, FIGS. 29 to 31 correspond to FIGS. 23 to 25 described previously. In FIGS. 29 to 31, parts or components similar to those described hereinbefore are denoted by like reference symbols and repeated description in detail thereof will be omitted.

At first, referring to FIG. 29, the SOI substrate including the p-type semiconductor substrate 109 as the pedestal or base includes a breach region provided as a part of the buried insulation film (dielectric layer) 3-1 in advance. A p-type active region 110 which is in contact with the semiconductor substrate 109 via the breach region is surrounded by a trench-isolated region 9.

Further, wafer process is performed on the SOI substrate shown in FIG. 29 to form the semiconductor elements primarily in the $n^-$-type semiconductor layer (SOI active layer) 2, whereon an anodizing current 111 is caused to flow from the p-type active region 110 toward the semiconductor substrate 109. Through this process, a porous silicon layer 112 is formed on a major plane of the semiconductor substrate 109.

Next, the insulation film mask 101 is so formed as to surround the cathode electrode 6 on the porous silicon layer 112, as shown in FIG. 7. The area occupied by the opened region of the insulation film mask 101 is so determined that the dielectric layer 3-1 is exposed around the cathode electrode 6 over an area whose radius is at least 40% of the distance L between the cathode electrode 6 and the anode electrode 7.

In succession, a high-speed silicon dry etching process is carried out from the back surface of the semiconductor substrate 109, to thereby eliminate the semiconductor substrate 109, as mentioned in conjunction with FIG. 17.

Subsequently, the dielectric layer 3-2 of the thick CVD oxide film is formed through the high-speed CVD deposit process, as shown in FIG. 30.

Finally, the back surface region is delaminated en bloc by making use of the porous silicon layer 112 serving as the delaminatable layer to thereby remove the insulation film mask 101 and the CVD oxide film (dielectric layer) 3-2 formed on the major surface of the semiconductor substrate 109. After polishing process, the back-surface electrode 8 is newly formed over the back surface through evaporation, as shown in FIG. 31.

In this manner, the electric characteristics or effects similar to those mentioned hereinbefore can be realized.

At this juncture, it should be added that description of the embodiments 1 to 8 has been made on the presumption that the present invention is applied to the semiconductor device 100 which is to serve as the SOI diode. It should however be appreciated that the teachings of the present invention disclosed herein can equally find application to SOI-MOSFET, SOI-IGBT and other high-voltage-rated lateral array type devices implemented on the SOI in general with equivalent advantageous effects.

Many modifications and variations of the present invention are possible in the light of the above techniques. It is therefore to be understood that within the scope of the appended claims, the invention may be practiced otherwise than as specifically described.

What is claimed is:

1. A dielectric separation type semiconductor device, comprising:

a semiconductor substrate;

a primary dielectric layer disposed adjacent to a whole region of a first main surface of said semiconductor substrate;

a first conductivity type first semiconductor layer of a low impurity concentration disposed on a surface of said primary dielectric layer in opposition to said semiconductor substrate so that said primary dielectric layer is sandwiched between said first conductivity type first semiconductor layer and said semiconductor substrate;

a first conductivity type second semiconductor layer of a high impurity concentration formed selectively on the surface of said first semiconductor layer;

a second conductivity type third semiconductor layer of a high impurity concentration disposed so as to surround an outer peripheral edge of said first semiconductor layer with a distance;

a ring-like insulation film disposed so as to surround an outer peripheral edge of said third semiconductor layer;

a first main electrode disposed in contact with a surface of said second semiconductor layer;

a second main electrode disposed in contact with a surface of said third semiconductor layer;

a sheet-like back-surface electrode disposed adjacent to a second main surface of said semiconductor substrate on a side opposite to said first main surface of said semiconductor substrate; and a first auxiliary dielectric layer disposed below said second semiconductor layer, said first auxiliary dielectric layer having a concave shape;

wherein a second auxiliary dielectric layer is disposed between said first auxiliary dielectric layer and said primary dielectric layer; and wherein said second auxiliary dielectric layer is junctioned to the semiconductor substrate and the first auxiliary dielectric layer.

2. The dielectric separation type semiconductor device according to claim 1, wherein said first auxiliary dielectric layer is so disposed that one end thereof is located at a position corresponding to said first main electrode; and wherein said first auxiliary dielectric layer extends over a region of a size not smaller than 40% of a distance between said first main electrode and said second main electrode.

3. The dielectric separation type semiconductor device according to claim 1, wherein said first auxiliary dielectric layer is shaped in a cylindrical form having a bottom; and wherein said second auxiliary dielectric layer is junctioned to said primary dielectric layer.

4. The dielectric separation type semiconductor device according to claim 1, wherein said first auxiliary dielectric layer is shaped in a up-side down bowl-like form.

5. The dielectric separation type semiconductor device according to claim 1, wherein said second auxiliary dielectric layer is formed by a thermally nitrided film or alternatively by a CVD nitride film.

6. The dielectric separation type semiconductor device according to claim 1, wherein said semiconductor substrate includes a p-type semiconductor region formed integrally with said semiconductor substrate.

7. The dielectric separation type semiconductor device according to claim 1, further comprising a back-surface electrode having a concave shape.

8. A method of manufacturing a dielectric separation type semiconductor device, comprising:

etching a semiconductor substrate with KOH within a region which covers a first main electrode and extends over an area of a size not smaller than 40% of a distance between said first main electrode and a second main electrode, thereby removing said semiconductor substrate in said region;

forming a first buried insulation film in said region; and forming a second buried insulation film immediately beneath said first buried insulation film in contact therewith, thereby obtaining said dielectric separation type semiconductor device in the form of a high-voltage-rated lateral array type semiconductor device implemented in a dielectric-isolated substrate and comprising:

said first main electrode and said second main electrode which is formed so as to surround said first main electrode;

said semiconductor substrate disposed on a back surface side of said dielectric-isolated substrate to serve as a base;

a primary dielectric layer disposed adjacent to a whole region of a first main surface of said semiconductor substrate;

a first conductivity type first semiconductor layer of a low impurity concentration disposed on a surface of said primary dielectric layer in opposition to said semiconductor substrate so that said primary dielectric layer is sandwiched between said first conductivity type first semiconductor layer and said semiconductor substrate;

a first conductivity type second semiconductor layer of a high impurity concentration formed selectively on the surface of said first semiconductor layer;

a second conductivity type third semiconductor layer of a high impurity concentration disposed so as to surround an outer peripheral edge of said first semiconductor layer with a distance;

a ring-like insulation film disposed so as to surround an outer peripheral edge of said third semiconductor layer;

said first main electrode disposed in contact with a surface of said second semiconductor layer;

said second main electrode disposed in contact with a surface of said third semiconductor layer;

a sheet-like back-surface electrode disposed adjacent to a second main surface of said semiconductor substrate on a side opposite to said first main surface of said semiconductor substrate; and a first auxiliary dielectric layer disposed below said second semiconductor layer, said first auxiliary dielectric layer having a concave shape;

wherein a second auxiliary dielectric layer is disposed between said first auxiliary dielectric layer and said primary dielectric layer; and wherein said second auxiliary dielectric layer is junctioned to the semiconductor substrate and the first auxiliary dielectric layer.

9. The method according to claim 8, wherein said second buried insulation film comprises a cured film of at least one curable polymer selected from the group consisting of a silicone series polymer, a polyimide series polymer, a polyimide silicone series polymer, a polyallylene ether series polymer, a bis-benzo-cyclobutene series polymer, a polychinoline series polymer, a perfluoro hydrocarbon series polymer, a fluorocarbon series polymer, an aromatic hydrocarbon series polymer, a borazine series polymer, a halide of a silicone series polymer, a halide of a polyimide series polymer, a halide of a polyimide silicone series polymer, a halide of a polyallylene ether series polymer, a halide of a bis-benzo-cyclobutene series polymer, a halide of a polychinoline series polymer, a halide of a perfluoro hydrocarbon series polymer, a halide of a fluorocarbon series polymer, a halide of an aromatic hydrocarbon series polymer, a halide of a borazine series polymer, a deuteride of a silicone series polymer, a deuteride of a polyimide series polymer, a deuteride of a polyimide silicone series polymer, a deuteride of a polyallylene ether series polymer, a deuteride of a bis-benzo-cyclobutene series polymer, a deuteride of a polychinoline series polymer, a deuteride of a perfluoro hydrocarbon series polymer, a deuteride of a fluorocarbon series polymer, a deuteride of an aromatic hydrocarbon series polymer, and a deuteride of a borazine series polymer.

10. The method according to claim 8, wherein said second buried insulation film comprises a cured film of a silicone series polymer represented by the following general formula (1):

$$[Si(O_{1/2})_4]_k\cdot[R^1Si(O_{1/2})_3]_l\cdot[R^2R^3Si(O_{1/2})_2]_m\cdot[R^4R^5R^6SiO_{1/2}]_n \quad (1)$$

wherein $R^1$, $R^2$, $R^3$, $R^4$, $R^5$ and $R^6$ are the same or different and represent an aryl group, hydrogen group, aliphatic series alkyl group, trialkylsilyl group, deuterium group, deuteroalkyl group, fluorine group, fluoro-alkyl group or functional group having an unsaturated bond, k, l, m and n represent integers each greater than 0 (zero), and 2k+(3/2)l+m+(1/2)n represents a natural number, wherein a mean molecular weight of each polymer is greater than 50 inclusive, and molecular terminal groups are the same or different and are an aryl group, hydrogen group, aliphatic series alkyl group, hydroxyl group, trialkylsilyl group, deuterium group, deuteroalkyl group, fluorine group, fluoro-alkyl group or functional group having an unsaturated bond.

11. The method according to claim 8, wherein said second buried insulation film comprises a cured film of a silicone series polymer having a ladder structure which is represented by a general formula (2) mentioned below:

(2)

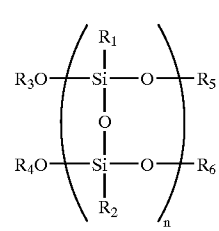

wherein $R_1$ and $R_2$ are the same or different and represent an aryl group, hydrogen group, aliphatic series alkyl group, hydroxyl group, deuterium group, deuteroalkyl group, fluorine group, fluoro-alkyl group or functional group having an unsaturated bond, $R_3$, $R_4$, $R_5$ and $R_6$ are the same or different and represent a hydrogen group, aryl group, aliphatic series alkyl group, trialkylsilyl group, hydroxyl group, deuterium group, deuteroalkyl group, fluorine group, fluoro-alkyl group or functional group having an unsaturated bond, n represents an integer, and a mean molecular weight of each polymer is greater than 50 inclusive.

12. The method according to claim 8, wherein said second buried insulation film comprises varnish or alternatively resin and is formed over a whole region of said dielectric-isolated substrate or alternatively formed selectively on said dielectric-isolated substrate through an application process selected from the group consisting of a rotor application process, a splay application process with micro-splay jets and a scan application process with a micro-nozzle.

13. The method according to claim 12, wherein said second buried insulation layer is formed by applying a first varnish prepared by PVSQ of 150 k in molecular weight solved in an anisole solution of 10 wt % and a second varnish prepared by PVSQ of 150 k in molecular weight solved in an anisole solution of 15 wt % sequentially at 100 rpm for 5 seconds, 300 rpm for 10 seconds and 500 rpm for 60 seconds, respectively, and wherein after said application process, a curing process is carried out by gradual cooling at a temperature of 350° C. for at least one hour.

14. The method according to claim 8, further comprising:

forming a crystallinity-destructed silicon layer after formation of said second buried insulation film, and removing partially said dielectric-isolated substrate by making use of said crystallinity-destructed silicon layer as a delaminatable layer.

15. The method according to claim 14, wherein said crystallinity-destructed silicon layer comprises a porous silicon layer.

* * * * *